United States Patent
Zhang et al.

(10) Patent No.: US 9,300,295 B1
(45) Date of Patent: Mar. 29, 2016

(54) ELIMINATION OF UNDESIRABLE CURRENT PATHS IN GSHE-MTJ BASED CIRCUITS

(71) Applicant: QUALCOMM Incorporated, San Diego, CA (US)

(72) Inventors: Yaojun Zhang, Pittsburgh, PA (US); Wenqing Wu, San Diego, CA (US); Kendrick Hoy Leong Yuen, San Diego, CA (US); Karim Arabi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/626,920

(22) Filed: Feb. 19, 2015

Related U.S. Application Data

(60) Provisional application No. 62/072,730, filed on Oct. 30, 2014.

(51) Int. Cl.
*H03K 19/18* (2006.01)
*H03K 19/20* (2006.01)
*H03K 19/003* (2006.01)

(52) U.S. Cl.
CPC .......... *H03K 19/00346* (2013.01); *H03K 19/18* (2013.01)

(58) Field of Classification Search
CPC . H03K 19/00346; H03K 19/18; H03K 19/20; H03K 3/45
USPC .................... 326/101, 38, 41, 47, 102, 104
See application file for complete search history.

(56) References Cited

U.S. PATENT DOCUMENTS

| | | | |
|---|---|---|---|
| 8,143,682 B2 | 3/2012 | Bratkovski et al. | |
| 8,400,066 B1 | 3/2013 | Pileggi | |
| 8,503,224 B2 | 8/2013 | Katti et al. | |
| 9,230,627 B2* | 1/2016 | Wu ...................... | G11C 11/161 |
| 2014/0142915 A1 | 5/2014 | Manipatruni et al. | |
| 2014/0291663 A1 | 10/2014 | Kuo et al. | |
| 2015/0145575 A1* | 5/2015 | Wu ......................... | H01L 43/08 327/187 |
| 2015/0145576 A1* | 5/2015 | Wu ......................... | H01L 43/08 327/187 |
| 2015/0213865 A1* | 7/2015 | Wu ...................... | G11C 11/161 365/158 |
| 2015/0213866 A1* | 7/2015 | Wu ...................... | G11C 11/161 365/158 |
| 2015/0213867 A1* | 7/2015 | Wu ..................... | G11C 11/1675 365/158 |
| 2015/0213868 A1* | 7/2015 | Wu ..................... | G11C 11/1693 365/154 |
| 2015/0213869 A1* | 7/2015 | Wu ..................... | G11C 11/1693 365/154 |

* cited by examiner

*Primary Examiner* — Daniel D Chang
(74) *Attorney, Agent, or Firm* — Muncy, Geissler, Olds & Lowe, P.C.

(57) ABSTRACT

Systems and methods pertain to avoiding undesirable current paths or sneak paths in spintronic logic gates formed from Giant Spin Hall Effect (GSHE) magnetic tunnel junction (MTJ) elements. Sneak path prevention logic is coupled to the GSHE MTJ elements, to prevent the sneak paths. The sneak path prevention logic may include one or more transistors coupled to the one or more GSHE MTJ elements, to restrict write current from flowing from an intended pipeline stage to an unintended pipeline stage during a write operation. The sneak path prevention logic may also include one or more diodes coupled to the one or more GSHE MTJ elements to prevent a preset current from flowing into input circuitry or a charge current generation circuit. A preset line may be coupled to the one or more GSHE MTJ elements to divert preset current from flowing into unintended paths.

20 Claims, 21 Drawing Sheets

| T(AND) | T(OR) | T(NAND) | T(NOR) |
|---|---|---|---|
| B1 B2 S(AND) | B1 B2 S(OR) | B1 B2 S(NAND) | B1 B2 S(NOR) |
| 0 0 0 | 0 0 0 | 0 0 1 | 0 0 1 |
| 0 1 0 | 0 1 1 | 0 1 1 | 0 1 0 |
| 1 0 0 | 1 0 1 | 1 0 1 | 1 0 0 |
| 1 1 1 | 1 1 1 | 1 1 0 | 1 1 0 |

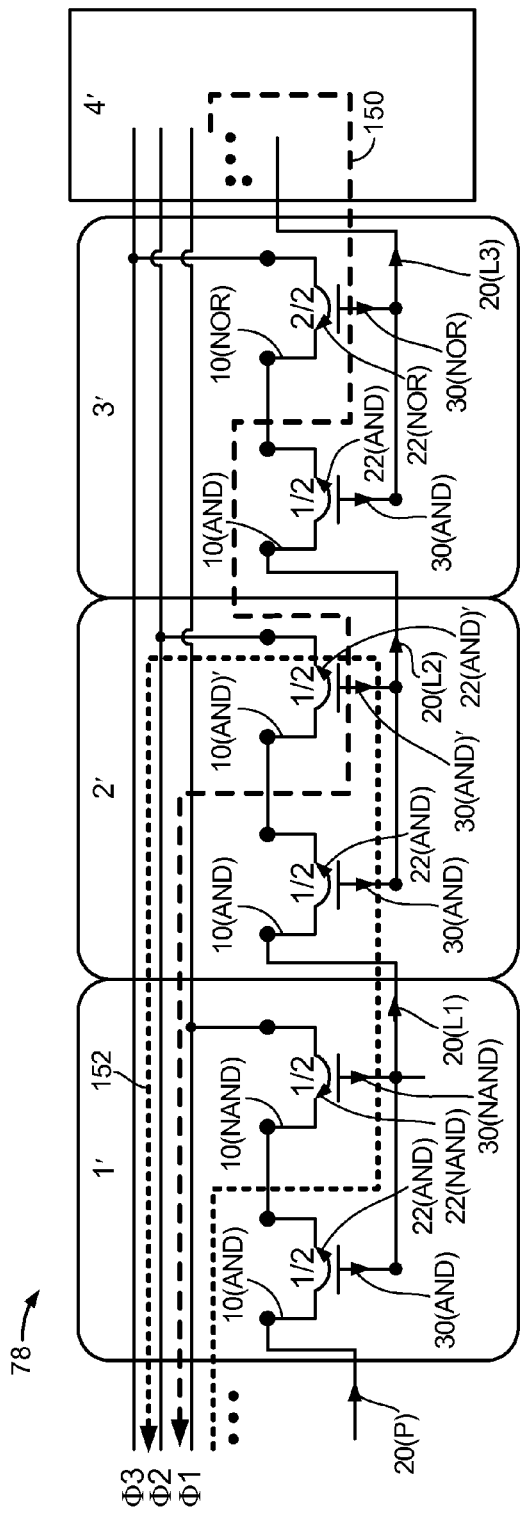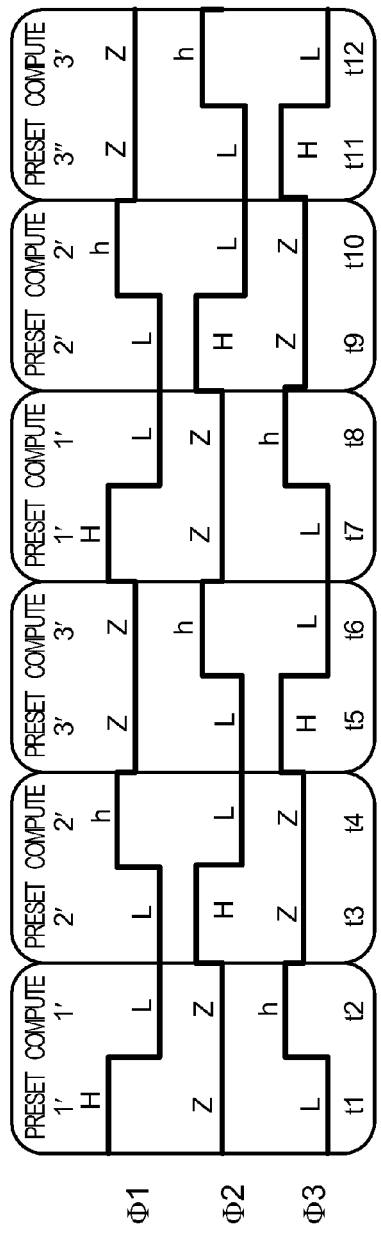
FIG. 15A
FIG. 15B

| | P | W1 | W2 |
|---|---|---|---|
| Preset 1 | 0 | 1 | Z |
| Write 1 | Z | 0 | 1 |
| Preset 2 | 0 | Z | 1 |
| Write 2 | Z | 1 | 0 |

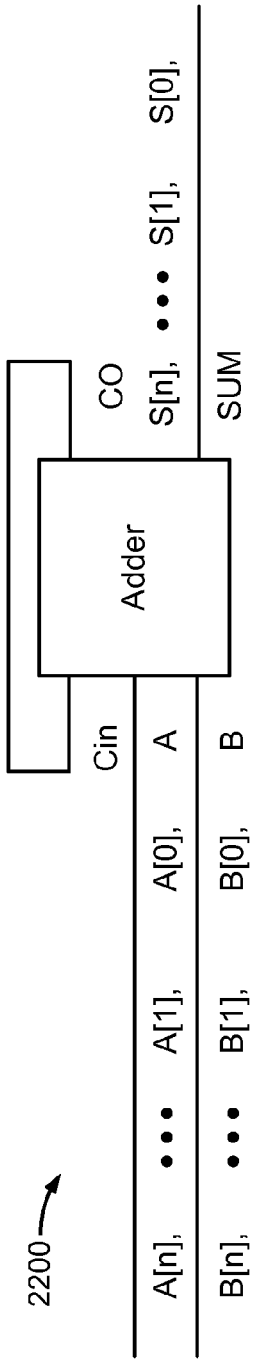
*FIG. 22A*
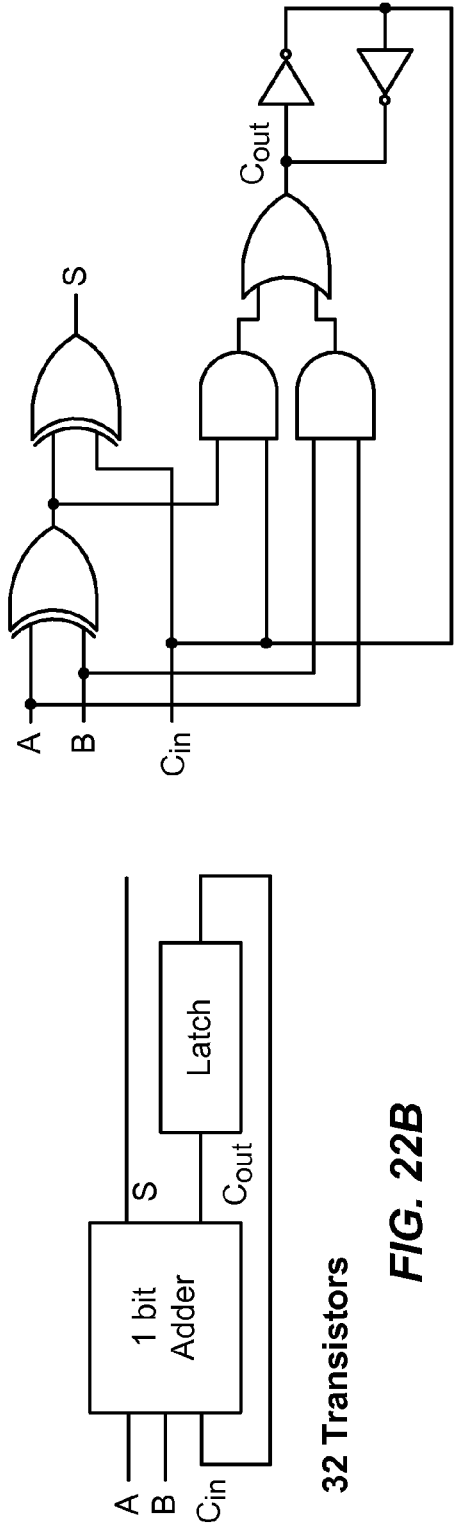
*FIG. 22C*
*FIG. 22B*

ELIMINATION OF UNDESIRABLE CURRENT PATHS IN GSHE-MTJ BASED CIRCUITS

CLAIM OF PRIORITY UNDER 35 U.S.C. §119

The present Application for Patent claims the benefit of Provisional Patent Application No. 62/072,730 entitled "ELIMINATION OF UNDESIRABLE CURRENT PATHS IN GSHE-MTJ BASED CIRCUITS" filed Oct. 30, 2014, and assigned to the assignee hereof and hereby expressly incorporated herein by reference in its entirety.

FIELD OF THE DISCLOSURE

Exemplary aspects of this disclosure relate to avoiding undesirable current paths or sneak paths in spintronic logic gates formed from GSHE-MTJ elements.

BACKGROUND

Modern electronic devices (e.g., laptops, computers, smart phones, tablets, and the like) are sequential state machines that perform various logical operations using combinations of logic gates. The prevalence of these modern electronic devices is driven in part by the many functions that are now enabled on such devices. Demand for such functions increases processing capability requirements of electronic devices and generates a need for more power-efficient devices. Accordingly, there is increasing pressure to continue miniaturizing logic gates and to reduce their power consumption. Miniaturization of components impacts all aspects of processing circuitry, including transistors and other reactive elements in the processing circuitry, such as metal oxide semiconductors (MOSs). MOS devices generally provide logic gates through combinations of transistors.

Historically, MOS devices have benefited from increasing miniaturization efforts. In the past, such semiconductor miniaturization not only reduced the footprint area occupied by the MOS devices in an integrated circuit (IC), but also reduced the power required to operate such ICs, thereby concurrently improving operating speeds. As the MOS devices were reduced to a nanometer scale (e.g., a ninety (90) nanometer scale), the footprint area occupied by the MOS devices in the IC was reduced, as expected. However, the MOS devices could not operate at an appreciably faster speed, because the mobility of the current mechanism (i.e., electrons or holes) did not also improve linearly, since mobility is a function of the effective mass of the current mechanism, and the effective mass was not changed with miniaturization.

Various techniques have been implemented to attempt to improve the speed with which transistor-based logic gates operate in the nanometer scale. Unfortunately, these techniques are problematic, as transistors have proved difficult to control. Furthermore, transistor-based logic gates continue to present power consumption problems as increases in transistor density have not introduced linear savings in power consumption. Transistor-based logic gates may thus be quickly reaching their design limits, and other types of technologies may be needed to continue the miniaturization of ICs. Thus, an effective technique is needed for creating logic gates and performing logical operations that are better adapted at the nanometer scale and are more power-efficient than current transistor-based technology.

In order to combat the aforementioned problems, spintronic logic gates employing a Giant Spin Hall Effect (GSHE) magnetic tunnel junction (MTJ) element(s) are being developed for performing logical operations. In general, the GSHE MTJ elements include a GSHE strip formed between a first terminal (A) and a second terminal (B), and a magnetic tunnel junction (MTJ), with a free layer of the MTJ interfacing the GSHE strip, and a top electrode of the MTJ coupled to a third terminal (C). A magnetization of an easy axis of the free layer of the MTJ is substantially perpendicular to the magnetization direction created by electrons traversing the GSHE strip between the first terminal (A) and the second terminal (B), such that the free layer of the MTJ is configured to switch based on a first charge current injected from/to the first terminal to/from the second terminal and a second charge current injected or extracted (i.e., positive/negative current directions) through the third terminal (C) into or out of the MTJ through the top electrode.

Spintronic logic gates formed from the GSHE MTJ elements have been shown to provide for greater power efficiency than transistor-based logic gates. Also, the spintronic logic gates are capable of being disposed in a relatively compact arrangement within an integrated circuit (IC). For example, the spintronic logic gates may perform logical operations with a smaller number of GSHE MTJ elements than a number of transistors required to perform the same logical operations with transistor-based logic gates. Also, while traditional combinational logic (i.e., logical circuits using transistor-based logic gates) must often employ separate sequential logic (e.g., latches, flip-flops, etc.) to store bit states resulting from the logical operations, the GSHE MTJ elements (i.e., the same elements used to perform the logical operations) may also operate as non-volatile memory to store bit states resulting from the logical operations. Therefore, not only can spintronic logic gates be used to fabricate more compact ICs (e.g., sequential state machines), the spintronic logic gates may also increase processing speeds and simplify IC designs.

In an example circuit or gate using spintronic logic a charge current generation circuit is coupled to a GSHE MTJ element to generate a charge current representing an input bit set. The input bit set may include one or more input bit states for a logical operation. A GSHE MTJ element may be initialized or preset to a preset state in a preset phase, prior to the logical operation. A threshold current level corresponding to the logical operation may be set for the GSHE MTJ element. In a compute phase, a GSHE spin current is generated in response to the charge current generated and the logical operation on the input bit set is performed, wherein the logical output bit state is set based on the preset state and whether the GSHE spin current exceeds threshold current level.

Spintronic circuits or gates can include several such GSHE MTJ elements, which may be cascaded in series or parallel and coupled to the charge current generation circuit. Accordingly, staged or pipelined operations can be performed, based on the characteristic of the GSHE MTJ elements to not only compute the logical output bit state but also hold or store the logical output bit state. For example, in a pipelined operation, the logical output bit state from a previous pipeline stage may be used for an input bit set in a following pipeline stage. Thus, the spintronic circuits using GSHE MTJ elements do not require additional latches or flip-flops which are seen in MOS based circuit designs for implementing pipelined or staged operations. Accordingly, significant power and area savings can be realized using spintronic logic gates.

However, the spintronic logic gates are also susceptible to undesirable charge or current paths which may arise in the various phases of logical operations. For some spintronic logic circuits, a reverse charge path may be created wherein a preset current used to establish the preset states may flow back to the charge current generation circuit or other input circuitry used to provide the input bit set to the spintronic logic gates. In some cases, it is possible for the charge current intended to write a spintronic logic gate in one pipeline stage to flow into an unintended pipeline stage. These charge or current paths are undesirable and may lead to incorrect operations or breaks in functionality of the spintronic logic circuits using GSHE MTJ elements.

Existing approaches to solving the undesired current paths are inefficient and/or ineffective. For example, one approach involves adding additional control lines or additional pipeline stages to separate the intended pipeline stage and the unintended pipeline stage in an effort to mitigate the flow of current from the intended pipeline stage to the unintended pipeline stage. However, such implementations significantly increase area and power and may also reduce speed of operation. Moreover, such implementations do not overcome the issues of undesirable current paths created due to the preset current flowing back into the input circuitry.

SUMMARY

Exemplary aspects of this disclosure relate to avoiding undesirable current paths or sneak paths in spintronic logic circuits comprising one or more GSHE-MTJ elements.

For example, an exemplary aspect is directed to a spintronic logic circuit comprising: one or more Giant Spin Hall Effect (GSHE) magnetic tunnel junction (MTJ) elements; and sneak path prevention logic coupled to the GSHE MTJ elements, the sneak path prevention logic configured to prevent sneak paths comprising the flow of charge current in unintended paths in the spintronic logic circuit. In one aspect, the spintronic logic circuit includes two or more pipeline stages comprising the one or more GSHE MTJ elements and a charge current generation circuit configured to provide write current to the one or more GSHE MTJ elements, wherein the sneak path prevention logic comprises one or more transistors coupled to the one or more GSHE MTJ elements, the transistors configured to restrict the write current from flowing from an intended pipeline stage to an unintended pipeline stage during a write operation. In another aspect, the sneak path prevention logic includes one or more diodes coupled to the one or more GSHE MTJ elements and configured to prevent a preset current from flowing into input circuitry or a charge current generation circuit. Additionally, a preset line may be configured to provide an alternative path for the preset current.

Another exemplary aspect is directed to method of preventing sneak paths in a spintronic logic circuit, the method comprising coupling one or more sneak path prevention logic elements to one or more Giant Spin Hall Effect (GSHE) magnetic tunnel junction (MTJ) elements of the spintronic logic circuit and preventing sneak paths comprising the flow of charge current in unintended paths in the spintronic logic circuit using the sneak path prevention logic elements.

Yet another exemplary aspect is directed to a spintronic logic circuit comprising: one or more Giant Spin Hall Effect (GSHE) magnetic tunnel junction (MTJ) elements and means for preventing sneak paths comprising the flow of charge current in unintended paths in the spintronic logic circuit.

BRIEF DESCRIPTION OF THE FIGURES

The accompanying drawings are presented to aid in the description of exemplary aspects and are provided solely for illustration of the aspects and not limitation thereof.

FIG. 15A illustrates another aspect of a pipeline circuit that includes pipeline stages with MTJ elements configured to perform AND operations, NAND operations, and NOR operations.

FIG. 15B illustrates a timing diagram representing control states of control signals used to synchronize and preset the pipeline circuit shown in FIG. 15A.

FIGS. 22A-C illustrate comparisons of adders formed from spintronic logic gates according to exemplary aspects and adders formed from conventional transistor gates.

DETAILED DESCRIPTION

Figure 1:
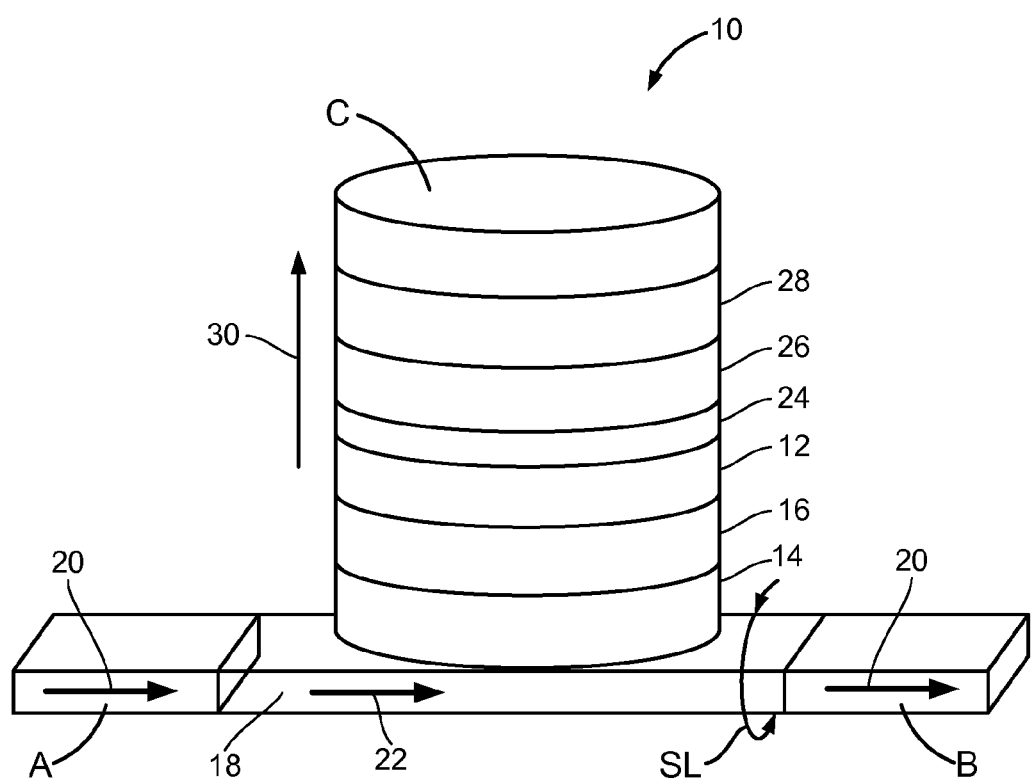
FIG. 1 illustrates a cross-sectional view of one aspect of a Giant Spin Hall Effect (GSHE) magnetic tunnel junction (MTJ) element that may be used in a spintronic logic gate to perform logical operations.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Aspects described herein are related to preventing the aforementioned undesirable current paths in spintronic logic gates employing Giant Spin Hall Effect (GSHE) magnetic tunnel junction (MTJ) element(s) for performing logical operations. In disclosed aspects, the spintronic logic gates may perform logical operations with a smaller number of GSHE MTJ elements than a number of transistors required to perform the same logical operations with transistor-based logic gates, while avoiding expensive overheads in terms of additional pipeline stages as in conventional implementations.

In this disclosure, the undesired flow of charge current from a write operation in an intended pipeline stage to an unintended pipeline stage is referred to as a "sneak path." In some aspects, in order to avoid the sneak paths for write operations, one or more transistors may be introduced in preselected circuit nodes. The one or more transistors are strategically placed within the circuit to effectively eliminate the sneak paths.

In some other aspects, one or more diodes may be used to restrict the reverse flow of current related to the preset current from entering charge generation circuitry or input circuitry. The preset current may be diverted and the diverted preset current may be flowed through a separate line or net. In this manner, sneak paths related to the reverse current may be eliminated. Where multiple pipeline stages are employed, the exemplary use of the diodes may also avoid the need for additional control signals between pipeline stages for curbing the sneak path. Since a separate line is employed for the preset current, any possible interference of the preset current with the input data for logical operations will also be avoided.

Accordingly, in exemplary aspects, logic comprising one or more transistors and/or one or more diodes may be configured to prevent sneak paths (e.g., related to write currents as well as preset currents) from flowing into unintended circuit paths. Such logic is referred to herein as sneak path prevention logic and comprises transistors, diodes, and any related control lines used to assist the sneak path prevention and diversion. However, it will be understood that the exemplary sneak path prevention logic does not include additional/dummy pipeline stages to damp or prevent the flow of sneak paths as employed by conventional approaches. For example, in some aspects, sneak path prevention logic includes one or more transistors coupled to the one or more GSHE MTJ elements, the transistors configured to restrict the write current from flowing from an intended pipeline stage to an unintended pipeline stage during a write operation. In some aspects, the sneak path prevention logic comprises one or more diodes coupled to the one or more GSHE MTJ elements configured to prevent a preset current from flowing into input circuitry or a charge current generation circuit. Moreover, a preset line may be added to provide an alternative path for the preset current. In example aspects, the sneak path prevention logic may be said to include one or more sneak path prevention logic elements, wherein the sneak path prevention logic elements may include one or more transistors, one or more diodes, a preset line, or a combination thereof.

In this regard, before discussing exemplary aspects for avoiding and eliminating sneak paths an introduction of the construction and operation of GSHE MTJ elements and their use in spintronic logic gate arrangements will first be provided.

FIG. 1 illustrates a cross-sectional view of one aspect of a GSHE MTJ element 10 that may be used in a spintronic logic gate. The cross-sectional view illustrates a stack of various layers, which may be utilized to provide the GSHE MTJ element 10. The GSHE MTJ element 10 shown in FIG. 1 includes a reference layer 12, a free layer 14, and a dielectric layer 16 that provides a tunnel barrier between the free layer 14 and the reference layer 12. The reference layer 12 has a magnetization that is fixed. As illustrated, the magnetization of the reference layer 12 is directed out of the page of the drawing and is in-plane to the reference layer 12.

A GSHE electrode 18 is coupled to the free layer 14 and is formed from a GSHE material, such as β-Tantalum, β-Tungsten, Rubidium, and/or Platinum as non-limiting examples. The GSHE electrode 18 is configured to receive a charge current 20 and generate a GSHE spin current 22 in response to the charge current 20. More specifically, the GSHE electrode 18 is configured to produce a GSHE that converts the charge current 20 into the GSHE spin current 22. The charge current 20 may represent an input bit set of one or more bit states. For example, the charge current 20 may have a charge current magnitude set in accordance with the one or more bit states of the input bit set. As such, a spin current magnitude of the GSHE spin current 22 may be set in accordance with the charge current magnitude of the charge current 20. Since the charge current magnitude is set in accordance with the one or more bit states of the input bit set, the spin current magnitude may also be set in accordance with the one or more bit states of the input bit set. For instance, the GSHE MTJ element 10 is configured to store a bit state as a logical output bit state, and has a threshold current level that determines when the logical output bit state is switched from a logical value (e.g., a logical value of "0") to an antipodal logical value (e.g., a logical value of "1"). Accordingly, the GSHE MTJ element 10 is configured to perform a logical operation on the input bit set by setting the logical output bit state based on whether the GSHE spin current 22 exceeds the threshold current level.

With regard to the free layer 14, a magnetization of the free layer 14 is transverse to a direction of propagation of the charge current 20 and in-plane to the free layer 14. A magnetic orientation alignment between the magnetization of the reference layer 12 and the magnetization of the free layer 14 represents the bit state (e.g., the logical output bit state) stored by the GSHE MTJ element 10. In this aspect, the magnetization of the free layer 14 may have a first magnetic orientation state where the magnetization of the free layer 14 is directed out of the page, and a second magnetic orientation state where the magnetization of the free layer 14 is directed into the page. As such, the bit state (e.g., the logical output bit state) stored by the GSHE MTJ element 10 is based on the magnetization of the free layer 14.

Since the magnetization of the reference layer 12 is fixed and the magnetization of the free layer 14 may be switched between the first magnetic orientation state and the second magnetic orientation state, the magnetic orientation alignment between the magnetization of the reference layer 12 and the magnetization of the free layer 14 may be provided in a parallel magnetic orientation alignment state and an anti-parallel magnetic orientation alignment state. More specifically, when the free layer 14 is in the first magnetic orientation state, the magnetic orientation alignment of the GSHE MTJ element 10 is provided in the parallel magnetic orientation alignment state because the magnetization of the free layer 14 and the magnetization of the reference layer 12 are aligned and in the same direction (i.e., the magnetization of the free layer 14 and the magnetization of the reference layer 12 both are directed out of the page). In this example, the bit state (e.g., the logical output bit state) stored by the GSHE MTJ element 10 represents a logical value of "0" when the magnetic orientation alignment of the GSHE MTJ element 10 is provided in the parallel magnetic orientation alignment state.

When the free layer 14 is in the anti-parallel magnetic orientation state, the magnetic orientation alignment of the GSHE MTJ element 10 is provided in the anti-parallel magnetic orientation alignment state because the magnetization of the free layer 14 and the magnetization of the reference layer 12 are not aligned, but in opposing directions (i.e., the magnetization of the free layer 14 is directed into the page and the magnetization of the reference layer 12 is directed out of the page). In this example, the bit state (e.g., the logical output bit state) stored by the GSHE MTJ element 10 represents a logical value of "1" when the magnetic orientation alignment of the GSHE MTJ element 10 is provided in the anti-parallel magnetic orientation alignment state. To set the magnetization of the free layer 14, the GSHE electrode 18 produces a GSHE that converts the charge current 20 into the GSHE spin current 22 due to spin-orbit interactions. The GSHE produced by the GSHE electrode 18 causes the GSHE spin current 22 to propagate substantially along an outer periphery of the GSHE electrode 18 and spin polarizes the GSHE spin current 22. More specifically, the GSHE spin current 22 is spin polarized such that a spin orientation of the GSHE spin current 22 is in-plane to an outer periphery of the GSHE electrode 18, but is transverse (e.g., orthogonal) to a direction of propagation of the charge current 20. The GSHE spin current 22 exerts a spin torque on the free layer 14 that can be utilized to change the magnetization of the free layer 14 between the first magnetic orientation state and the second magnetic orientation state. After the GSHE spin current 22 propagates out of the GSHE electrode 18, the spin polarization of the GSHE spin current 22 is lost and the GSHE spin current 22 is converted back into the charge current 20.

FIG. 1 illustrates that the GSHE MTJ element 10 has a first terminal or charge current node A, a second terminal or charge current node B, and a third terminal or charge current node C. The GSHE MTJ element 10 may receive the charge current 20 so that the charge current 20 propagates from the charge current node A to the charge current node B, or the GSHE MTJ element 10 may receive the charge current 20 so that the charge current 20 propagates from the charge current node B to the charge current node A. In this manner, the GSHE MTJ element 10 can be switched from the second magnetic orientation state to the first magnetic orientation state and from the first magnetic orientation state to the second magnetic orientation state, as explained in further detail below. A resistance of the GSHE MTJ element 10 is provided between a charge current node C and the GSHE electrode 18. When the free layer 14 is in the second magnetic orientation state, the magnetic orientation alignment of the GSHE MTJ element 10 is in the anti-parallel magnetic orientation alignment state. Thus, the resistance of the GSHE MTJ element 10 between the charge current node C and the GSHE electrode 18 is provided in a first resistive state, which in this aspect is a high resistance state. When the free layer 14 is in the first magnetic orientation state, the magnetic orientation alignment of the GSHE MTJ element 10 is in the parallel magnetic orientation alignment state. Thus, the resistance of the GSHE MTJ element 10 between the charge current node C and the GSHE electrode 18 is provided in a second resistive state, which in this aspect is a low resistance state.

In FIG. 1, the charge current 20 is shown propagating from a charge current node A to a charge current node B. As a result, the GSHE spin current 22 generated in response to the charge current 20 is spin polarized along the outer periphery such that the spin orientation of the GSHE spin current 22 is aligned along a spin loop SL. In this case, if the magnetization of the free layer 14 is in the second magnetic orientation state and the GSHE spin current 22 is greater than the threshold current level, the magnetization of the free layer 14 is switched from the second magnetic orientation state to the first magnetic orientation state. However, if the magnetization of the free layer 14 is in the second magnetic orientation state but the GSHE spin current 22 is less than the threshold current level, the magnetization of the free layer 14 is maintained in the second magnetic orientation state. Finally, if the magnetization of the free layer 14 was already in the first magnetic orientation state, the magnetization of the free layer 14 is maintained in the first magnetic orientation state. When the free layer 14 is in the first magnetic orientation state, the magnetic orientation alignment of the GSHE MTJ element 10 is in the parallel magnetic orientation alignment state. Thus, the resistance of the GSHE MTJ element 10 between the charge current node C and the GSHE electrode 18 is provided in the first resistive state, which in this aspect is the low resistance state.

Similarly, the charge current 20 may be generated so as to propagate from the charge current node B to the charge current node A. As a result, the GSHE spin current 22 generated in response to the charge current 20 is spin polarized along the outer periphery such that the spin orientation of the GSHE spin current 22 is aligned opposite the spin loop SL shown in FIG. 1. In this case, if the magnetization of the free layer 14 is in the first magnetic orientation state and the charge current 20 is above the threshold current level, the magnetization of the free layer 14 is switched from the first magnetic orientation state to the second magnetic orientation state. However, if the magnetization of the free layer 14 is in the first magnetic orientation state but the GSHE spin current 22 is less than the threshold current level, the magnetization of the free layer 14 is maintained in the first magnetic orientation state. Finally, if the magnetization of the free layer 14 was already in the second magnetic orientation state, the magnetization of the free layer 14 is maintained in the second magnetic orientation state. When the free layer 14 is in the second magnetic orientation state, the magnetic orientation alignment of the GSHE MTJ element 10 is in the anti-parallel magnetic orientation alignment state. Thus, the resistance of the GSHE MTJ element 10 between the charge current node C and the GSHE electrode 18 is provided in the first resistive state, which in this aspect is the high resistance state.

In this aspect, the charge current node A is provided as the first terminal by the GSHE MTJ element 10, the charge current node B is provided as the second terminal by the GSHE MTJ element 10, and the charge current node C is provided as the third terminal by the GSHE MTJ element 10. As such, the charge current node A, the charge current node B, and the charge current node C may be formed from a metallic layer, such as copper (Cu). The GSHE electrode 18 is formed between the charge current node A and the charge current node B. However, the GSHE MTJ element 10 is formed such that the reference layer 12 and the free layer 14 are stacked between the GSHE electrode 18 and the charge current node C.

The GSHE MTJ element 10 further comprises a barrier layer 24, a pinning layer 26, and an antiferromagnetic layer 28. In this aspect, the charge current node C is provided on the antiferromagnetic layer 28 and the free layer 14 is provided on the GSHE electrode 18. The barrier layer 24, the pinning layer 26, and the antiferromagnetic layer 28 provide a magnetically rigid component so that the magnetic orientation of the reference layer 12 is fixed so as to be directed out of the page. The barrier layer 24 is formed on the reference layer 12, while the pinning layer 26 is formed on the barrier layer 24. In this manner, the barrier layer 24 is provided between the pinning layer 26 and the reference layer 12. The antiferromagnetic layer 28 helps secure the magnetization of the pinning layer 26.

To read the bit state (e.g., the logical output bit state) stored by the GSHE MTJ element 10, the GSHE MTJ element 10 is configured to generate a charge current 30 through the GSHE MTJ element 10 propagating from/to the GSHE electrode 18 to/from the charge current node C. When the magnetic orientation alignment of the GSHE MTJ element 10 is in the anti-parallel magnetic orientation alignment state and the resistance of the GSHE MTJ element 10 is provided in the first resistive state (i.e., the high resistance state), the charge current 30 is in a low current state. When the GSHE MTJ element 10 is in the parallel magnetic orientation alignment state and the resistance of the GSHE MTJ element 10 is provided in the second resistive state (i.e., the low resistance state), the charge current 30 is in a high current state. In this manner, the charge current 30 can be used to represent the bit state (e.g., a logical value of "1" or "0") being stored by the GSHE MTJ element 10. The GSHE MTJ element 10 is inherently non-volatile, and thus may be used to store the corresponding bit state (e.g., the logical value of "1" or "0") without requiring a separate sequential state element (e.g., a latch, flip-flop, etc.). The magnetic orientation alignment and the resistance (and thus the bit state) of the GSHE MTJ element 10 can be sensed by detecting the resistance, a voltage level, and/or a current magnitude of the charge current 30 between the GSHE electrode 18 and the charge current node C.

Figure 2A:
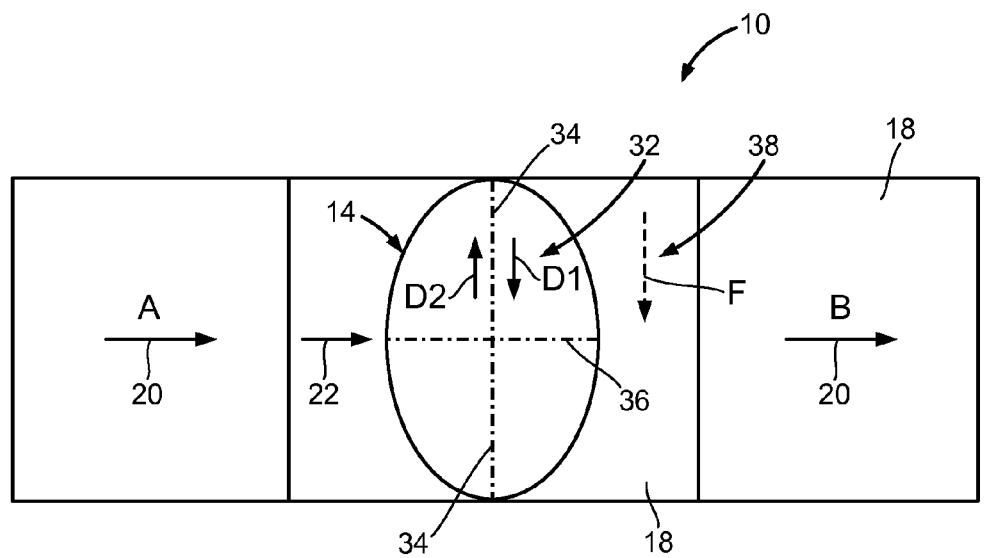
FIG. 2A illustrates a top-down view of one exemplary aspect of a GSHE electrode and a free layer of the GSHE MTJ element shown in FIG. 1.

FIG. 2A illustrates a top-down view of one exemplary aspect of the GSHE electrode 18 and the free layer 14 of the GSHE MTJ element 10 shown in FIG. 1. More specifically, FIG. 2A shows a magnetization 32 of the free layer 14, where the free layer 14 is elliptical in shape. In this aspect, the magnetization 32 of the free layer 14 is aligned with a major axis 34 of the free layer 14, while the charge current 20 propagates so as to be aligned with a minor axis 36 of the free layer 14. In this aspect, the major axis 34 is an easy axis of magnetization for the free layer 14, while the minor axis 36 is a hard axis of magnetization for the free layer 14. When the charge current 20 is provided so as to propagate from the charge current node A to the charge current node B and is provided above the threshold current level, the magnetization 32 of the free layer 14 is switched to or is maintained in the first magnetic orientation state where the magnetization 32 is provided in a direction D1. In this aspect, the direction D1 is aligned with the major axis 34 and is parallel to a direction F of a magnetization 38 of the reference layer 12 (shown in FIG. 1). Thus, the magnetic orientation alignment between the magnetization 38 of the reference layer 12 and the magnetization 32 of the free layer 14 is in the parallel magnetic orientation alignment state because the magnetization 32 of the free layer 14 and the magnetization 38 of the reference layer 12 are parallel with respect to one another. Since the major axis 34 and the minor axis 36 are orthogonal to one another, the magnetization 32 of the free layer 14 and the magnetization 38 of the reference layer 12 are also orthogonal to the minor axis 36.

When the charge current 20 is provided so as to propagate in a direction from the charge current node B to the charge current node A and is provided above the threshold current level, the magnetization 32 of the free layer 14 is switched to or is maintained in the second magnetic orientation state where the magnetization 32 is provided in a direction D2. The direction D2 is parallel to the major axis 34 and is anti-parallel to the direction F of the magnetization 38 of the reference layer 12. Thus, the magnetic orientation alignment of the GSHE MTJ element 10 shown in FIG. 1 is in the anti-parallel magnetic orientation alignment state, because the magnetization 32 of the free layer 14 and the magnetization 38 of the reference layer 12 are anti-parallel with respect to one another. Since the major axis 34 and the minor axis 36 are orthogonal to one another, the magnetization 32 of the free layer 14 and the magnetization 38 of the reference layer 12 are also orthogonal to the minor axis 36. Note that since the charge current 20 propagates orthogonally with respect to the major axis 34 (i.e., the easy axis) and in alignment with the minor axis 36 (i.e., the hard axis), a switching field applied by the GSHE spin current 22 to the free layer 14 is along the major axis 34. Thus, the free layer 14 is positioned in the most favorable orientation of magnetic anisotropy. The GSHE MTJ element 10 shown in FIG. 2A is thus configured such that the threshold current level is at a maximum.

Figure 2B:
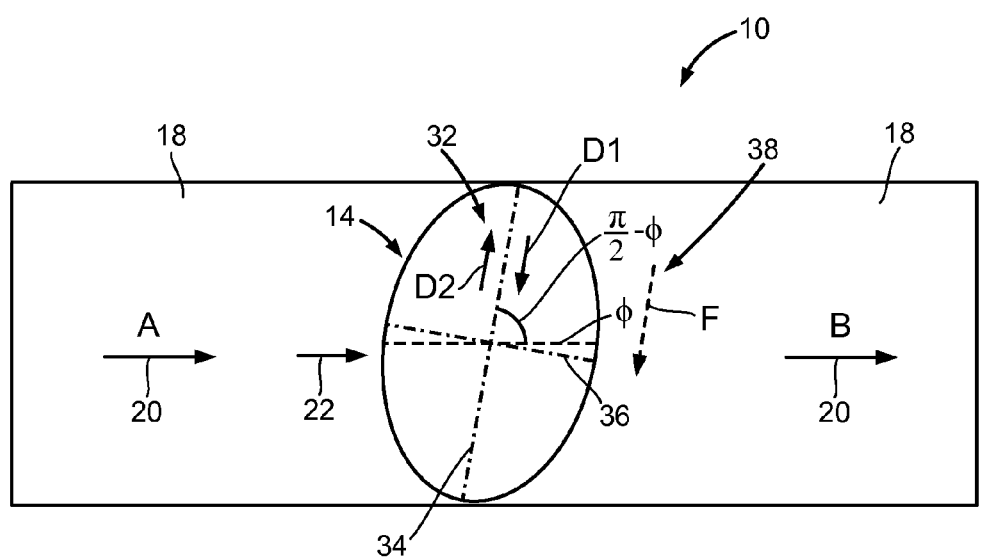
FIG. 2B illustrates a top-down view of another exemplary aspect of a GSHE electrode and a free layer of the GSHE MTJ element shown in FIG. 1.

FIG. 2B illustrates a top-down view of another exemplary aspect of the GSHE electrode 18 and the free layer 14 of the GSHE MTJ element 10 shown in FIG. 1. As in the aspect shown in FIG. 2A, the magnetization 32 of the free layer 14 can be provided in the first magnetic orientation state with the direction D1, which is parallel to direction F of the magnetization 38 of the reference layer 12. The magnetization 32 of the free layer 14 can also be provided in the second magnetic orientation state with the direction D2, which is anti-parallel to the direction F of the magnetization 38 of reference layer 12. However, the charge current 20 shown in FIG. 2B propagates so as to be substantially aligned with an axis 39. In this aspect, the free layer 14 is positioned such that the minor axis 36 (i.e., the hard axis) of the free layer 14 is tilted at an angle φ with respect to the propagation of the charge current 20. As such, the minor axis 36 of the free layer 14 is tilted at the angle φ relative to the axis 39. Thus, the major axis 34 (i.e., the easy axis) is tilted at an angle $$\frac{\pi}{2} - \phi$$

with respect propagation of the charge current 20. Free of an external magnetic field, the magnetization 32 of the free layer 14 and the magnetization 38 of the reference layer 12 are aligned along the major axis 34 of the free layer 14. Therefore, the directions D1, D2, and F are also tilted at the angle $$\frac{\pi}{2} - \phi$$

with respect to the propagation of the charge current 20. Accordingly, the GSHE MTJ element 10 shown in FIG. 2B has the free layer 14 positioned such that the charge current 20 propagates with a directional component along the major axis 34 (i.e., the easy axis) and a directional component along the minor axis 36 (i.e., the hard axis). As such, the switching field applied by the GSHE spin current 22 to the free layer 14 has a directional component along the major axis 34 and a directional component along the minor axis 36.

The GSHE MTJ element 10 shown in FIG. 2B is thus configured such that the threshold current level is lower in comparison to the aspect shown in FIG. 2A. Setting the angle φ thus provides a technique for controlling the threshold current level of the GSHE MTJ element 10. The threshold current level of the GSHE MTJ element 10 is at a minimum when the angle φ is around $$\pm \frac{\pi}{4}$$

Figure 7:
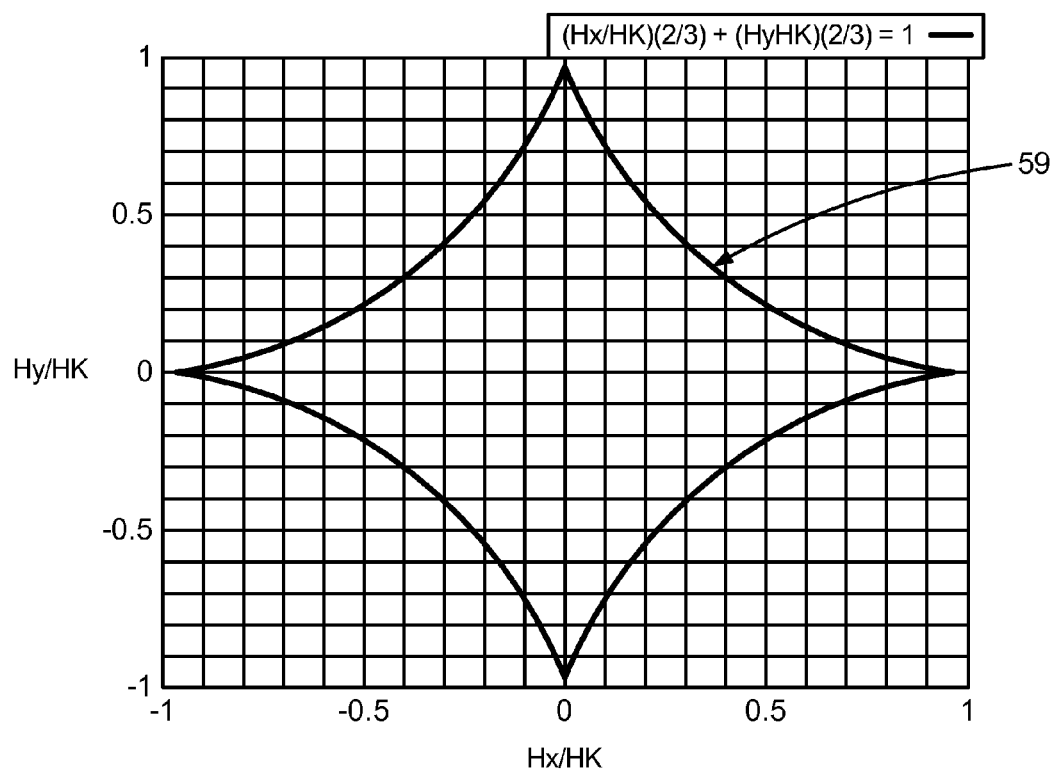
FIG. 7 is a graph that illustrates one aspect of a Stoner-Wohlfarth Switching Astroid 59 that indicates a threshold current level of the GSHE MTJ element shown in FIG. 1.

(see FIG. 7).

Figure 3:
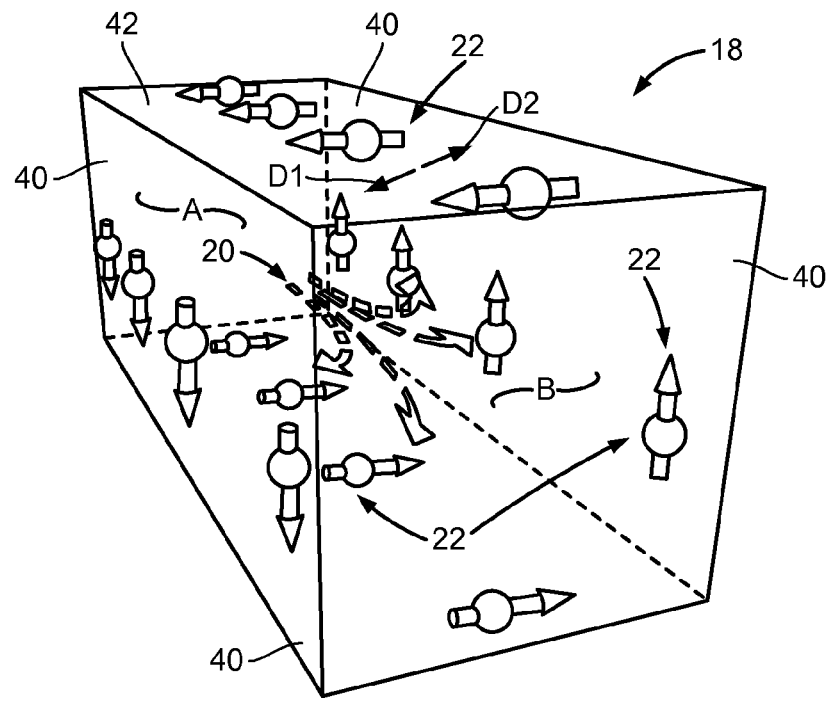
FIG. 3 is a perspective view of a GSHE electrode of the GSHE MTJ element shown in FIG. 1.

FIG. 3 is a perspective view of the GSHE electrode 18 of the GSHE MTJ element 10 shown in FIGS. 1, 2A, and 2B. The GSHE electrode 18 is configured to provide a GSHE that converts the charge current 20 to the GSHE spin current 22. The GSHE electrode 18 is formed from a GSHE material. The GSHE material results in the GSHE, causing a spin-polarized diffusion of electrons in directions that are traverse to the flow of the charge current 20, as shown in FIG. 3. The GSHE is due to spin-orbit coupling in the GSHE electrode 18, and the spin-polarized diffusion deflects the electrons to an outer periphery 40 of the GSHE electrode 18. As a result, the charge current 20 is converted into the GSHE spin current 22. The GSHE material that forms the GSHE electrode 18 may be a metal with a high atomic number, such as Tantalum, Rubidium, Tungsten, and/or Platinum. For example, the GSHE electrode 18 may be formed from high-resistivity forms of beta-Tantalum and beta-Tungsten. As shown in FIG. 3, the GSHE spin current 22 is spin-polarized such that a spin orientation of the GSHE spin current 22 is in-plane to the outer periphery 40 of the GSHE electrode 18, but traverse (e.g., orthogonal) to the direction of propagation of the charge current 20.

In this aspect, the charge current 20 in FIG. 3 is provided so as to propagate from the charge current node A to the charge current node B. Furthermore, the free layer 14 (shown in FIG. 1) has been formed on an electrode surface 42 at the outer periphery 40 of the GSHE electrode 18. As shown in FIG. 3, the GSHE spin current 22 thus has a spin polarization in the direction D1 along the electrode surface 42. Although electrons in the GSHE spin current 22 are reflected by the free layer 14, the GSHE spin current 22 exerts a spin torque on the free layer 14 that drives the magnetization of the free layer 14 in the direction D1. If the charge current 20 has been provided so as to propagate from the charge current node B to the charge current node A, the GSHE spin current 22 is generated so as to have the spin polarization in the direction D2 along the electrode surface 42. In this case, the GSHE spin current 22 exerts a spin torque on the free layer 14 that drives the magnetization 32 (shown in FIGS. 2A and 2B) of the free layer 14 in the direction D2. After the GSHE spin current 22 propagates out of the GSHE electrode 18, the spin polarization of the GSHE spin current 22 is lost and the GSHE spin current 22 is converted back into the charge current 20.

At the electrode surface 42 of the GSHE electrode 18 adjoining the free layer 14, the GSHE spin current 22 is generated by the GSHE electrode 18 where a current magnitude of the GSHE spin current 22 is related to a current magnitude of the charge current 20 in accordance to a Spin Hall angle $\theta_{SH}$ (not shown). The Spin Hall angle $\theta_{SH}$ defines a Spin Hall ratio:

$$\theta_{SH} = (J_S/(h/2))/(J_C/e)$$

$J_S$=a current density of the GSHE spin current 22
h=Planck's constant divided by 2π
$J_C$=a current density of the charge current 20
e=charge of an electron Forming the GSHE electrode 18 from Tantalum, Rubidium, Tungsten, and/or Platinum in high-resistivity forms may improve the GSHE in orders of magnitude to ~0.30. As such, the GSHE provided by the GSHE electrode 18 is several orders of magnitude greater than a Spin Hall Effect (SHE) produced with previously known electrodes. The GSHE generated from the charge current 20 by the GSHE electrode 18 thus provides an efficient way to convert the charge current 20 into the charge current 30.

Figure 4:
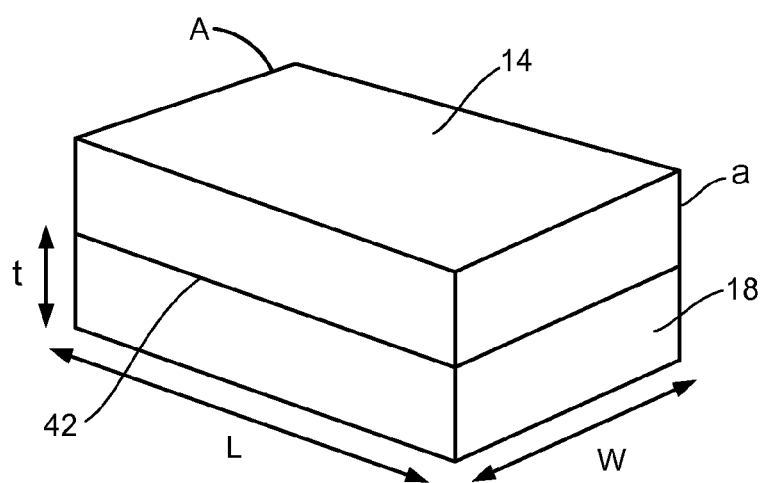
FIG. 4 illustrates one aspect of a free layer and a GSHE electrode of the GSHE MTJ element shown in FIG. 1.

FIG. 4 illustrates one aspect of the free layer 14 and the GSHE electrode 18, wherein the electrode surface 42 of the GSHE electrode 18 adjoins the free layer 14. The ratio of a current magnitude $I_S$ of the GSHE spin current 22 and a current magnitude $I_C$ of the charge current 20 is related to a geometry of the free layer 14 and the GSHE electrode 18. In FIG. 4, a length of the free layer 14 and the GSHE electrode 18 is shown as L, a width of the free layer 14 and the GSHE electrode 18 is shown as W, and a height of the GSHE electrode 18 is shown as t. Thus, an area a that the charge current 20 passes through is defined as the height t multiplied by the width W. An area A that the spin current 22 passes through is defined as the length L multiplied by the width W. The ratio of the current magnitude $I_S$ of the GSHE spin current 22 and the current magnitude $I_C$ of the charge current 20 can therefore be shown as:

$$(I_S/(h/2))/(I_C/e)) = (J_S A)/(J_C a) = \theta_{SH}(A/a) = \theta_{SH}(L/t)$$

As such, for the Spin Hall angle $\theta_{SH}$ of ~0.30, with a length L of approximately 50-100 nm and a height t of approximately 2 nm, the ratio $(I_S/(h/2))/(I_C/e)$ of the current magnitude $I_S$ and the current magnitude k is between 7.5 and 15. Spin torque transfer (STT) provides an equivalent ratio of only ~0.60. Accordingly, in comparison to spin torque transfer (STT), this represents hundreds of times less power being consumed by the GSHE MTJ element 10 when compared to STT techniques.

Figure 5:
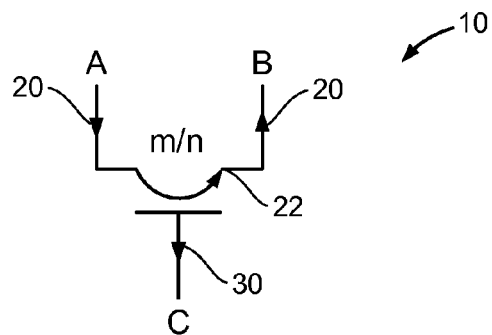
FIG. 5 is a visual illustration of an operative symbol used to represent the GSHE MTJ element shown in FIG. 1.

FIG. 5 is an operative symbol used to represent the GSHE MTJ element 10 of FIG. 1. The GSHE MTJ element 10 is configured to receive the charge current 20. The charge current 20 propagates in a current direction from the charge current node A to the charge current node B when received at the charge current node A. When the charge current 20 is received at the charge current node B, the charge current 20 propagates in a current direction from the charge current node B to the charge current node A. In response to the charge current 20, the GSHE MTJ element 10 generates the GSHE spin current 22 between the charge current node A and the charge current node B.

An integer n is an integer number of MTJ input nodes of other MTJ elements that are to be connected to the GSHE MTJ element 10. An integer m indicates how many of the other MTJ elements are provided having a resistance in the low resistance state so that the GSHE MTJ element 10 generates the GSHE spin current 22 at a level greater than or equal to the threshold current level. If a number of the other MTJ elements that have their resistances set in the low resistance state is equal to or greater than the integer number m, the GSHE spin current 22 switches the magnetic orientation alignment of the GSHE MTJ element 10 to the parallel magnetic orientation state when the charge current 20 propagates in a current direction from the charge current node A to the charge current node B. If the number of the other MTJ elements that have their resistances set in the low resistance state is equal to or greater than the integer number m, the GSHE spin current 22 switches the magnetic orientation alignment of the GSHE MTJ element 10 to the anti-parallel magnetic orientation state when the charge current 20 propagates in a current direction from the charge current node B to the charge current node A. Otherwise, if the number of the other MTJ elements that have their resistances set in the low resistance state is less than the integer number m, the magnetic orientation alignment of the GSHE MTJ element 10 is maintained. The GSHE MTJ element 10 may be designed and fabricated to have the integer number m at a particular integer value. Thus, the integer number m indicates the threshold current level of the GSHE MTJ element 10. To read the bit state (i.e., the logical output bit state) stored by the GSHE MTJ element 10, the GSHE MTJ element 10 is configured to generate the charge current 30 representing the bit state from the charge current node C. The GSHE MTJ element 10 may generate the charge current 30 in response to a control voltage applied between the charge current node C and either the charge current node A or the charge current node B.

Figure 6A:
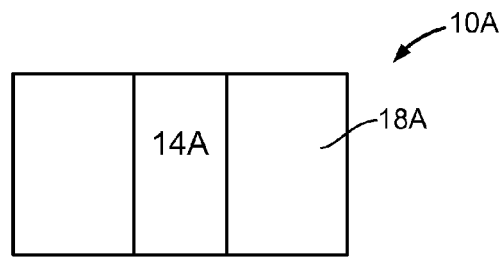
FIG. 6A illustrates one example of a GSHE MTJ element, which is one aspect of the GSHE MTJ element shown in FIG. 1.

FIG. 6A illustrates an exemplary aspect of a GSHE MTJ element 10A, which is one aspect of the GSHE MTJ element 10 described above with regard to FIG. 1. A free layer 14A of the GSHE MTJ element 10A and a GSHE electrode 18A are shown in FIG. 6A, and are aspects of the free layer 14 and the GSHE electrode 18 shown in FIG. 1, respectively. To control the integer m (not shown), a thickness of the free layer 14A may be controlled. Accordingly, by controlling the thickness of the free layer 14A, the integer m, and thus the threshold current level, is set.

Figure 6B:
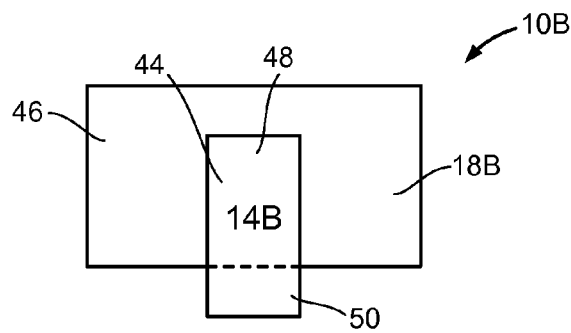
FIG. 6B illustrates another example of a GSHE MTJ element, which is another aspect of the GSHE MTJ element shown in FIG. 1.

It may be difficult to precisely control the thickness of the free layer 14A to set the threshold current level. As such, FIG. 6B illustrates another aspect of a GSHE MTJ element 10B. A free layer 14B of the GSHE MTJ element 10B and a GSHE electrode 18B are shown in FIG. 6B, and are aspects of the free layer 14 and the GSHE electrode 18 shown in FIG. 1, respectively. The free layer 14B has a magnetic layer surface 44 disposed on an electrode surface 46 of the GSHE electrode 18B such that the magnetic layer surface 44 partially overlaps the electrode surface 46 of the GSHE electrode 18B. More specifically, the magnetic layer surface 44 is disposed on the electrode surface 46 such that a first area 48 of the magnetic layer surface 44 overlaps the electrode surface 46 of the GSHE electrode 18B, and a second area 50 of the magnetic layer surface 44 does not overlap the electrode surface 46 of the GSHE electrode 18B. In this manner, the integer m is set along with the threshold current level of the GSHE MTJ element 10B. Accordingly, controlling the amount of overlap between the free layer 14B and the GSHE electrode 18B can be used to set the threshold current level of the GSHE MTJ element 10B.

Figure 6C:
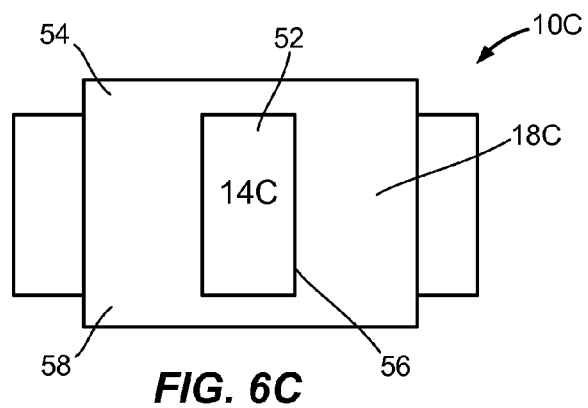
FIG. 6C illustrates yet another example of a GSHE MTJ element, which is yet another aspect of the GSHE MTJ element shown in FIG. 1.

FIG. 6C illustrates another aspect of a GSHE MTJ element 10C. A free layer 14C of the GSHE MTJ element 10C and a GSHE electrode 18C are shown in FIG. 6C, and are aspects of the free layer 14 and the GSHE electrode 18 shown in FIG. 1, respectively. The free layer 14C has a magnetic layer surface 52 disposed on an electrode surface 54 of the GSHE electrode 18C. More specifically, the GSHE electrode 18C is shaped such that a first area 56 of the electrode surface 54 overlaps the magnetic layer surface 52. A second area 58 of the electrode surface 54 does not overlap the magnetic layer surface 52. The second area 58 of the electrode surface 54 surrounds the magnetic layer surface 52. In this manner, the integer m is set along with the threshold current level of the GSHE MTJ element 10C. As such, controlling a size of the first area 56 and a size of the second area 58 of the electrode surface 54 can be used to determine the threshold current level.

FIG. 7 is a graph that illustrates one aspect of a Stoner-Wohlfarth Switching Astroid 59 that indicates the threshold current level of the GSHE MTJ element 10 shown in FIG. 1. Assuming that an easy axis (e.g., the major axis 34 in FIGS. 2A and 2B) of the free layer 14 is an x-axis of the free layer 14, while a y-axis (e.g., the minor axis 36 in FIGS. 2A and 2B) is in-plane to the free layer 14 but orthogonal to the x-axis, a switching field H applied to the free layer 14 has a switching field component $H_x$ along the x-axis and a switching field component $H_y$ along a y-axis. In this case, the switching field H is generated as a result of the GSHE spin current 22. A magnetic anisotropy field (e.g., the magnetization 32 of the free layer 14 shown in FIGS. 2A and 2B) is represented by HK. The Stoner-Wohlfarth Switching Astroid 59 shown in FIG. 7 indicates a threshold field magnitude of the switching field component $H_x$ and a threshold field magnitude of the switching field component $H_y$ that switches the magnetization 32 of the free layer 14 from one magnetic orientation alignment state to another magnetic orientation alignment state (e.g., from the first magnetic orientation state to the second magnetic orientation state or from the second magnetic orientation state to the first magnetic orientation state). Consequently, in order to switch the magnetization 32 of the free layer 14, the GSHE spin current 22 (shown in FIG. 1) has to generate the switching field H such that the switching field component $H_x$ exceeds its threshold field magnitude and the switching field component $H_y$ exceeds its threshold field magnitude, which are plotted along the Stoner-Wohlfarth Switching Astroid 59. Accordingly, the Stoner-Wohlfarth Switching Astroid 59 indicates the threshold current level of the GSHE MTJ element 10. In this example, the Stoner-Wohlfarth Switching Astroid 59 has been normalized with respect to the magnetic anisotropy field HK.

The equation for the Stoner-Wohlfarth Switching Astroid 59 of FIG. 7 is $$\frac{H_x}{H_K}^{\frac{2}{3}} + \frac{H_y}{H_K}^{\frac{2}{3}} = 1.$$

The Stoner-Wohlfarth Switching Astroid 59 of FIG. 7 demonstrates that the threshold field magnitude of the switching field component $H_x$ and the threshold field magnitude of the switching field component $H_y$ change as an angle between the magnetization 32 and the switching field H change. Thus, the threshold current level of the GSHE MTJ element 10 changes as the angle between the easy axis and the direction of propagation of the charge current 20 changes. Accordingly, the threshold current level is different with regard to the aspects of the GSHE MTJ element 10 shown in FIGS. 2A and 2B. As a result, the integer value of the GSHE MTJ element 10 may be set by the angle φ (see FIG. 2B).

Figure 8:
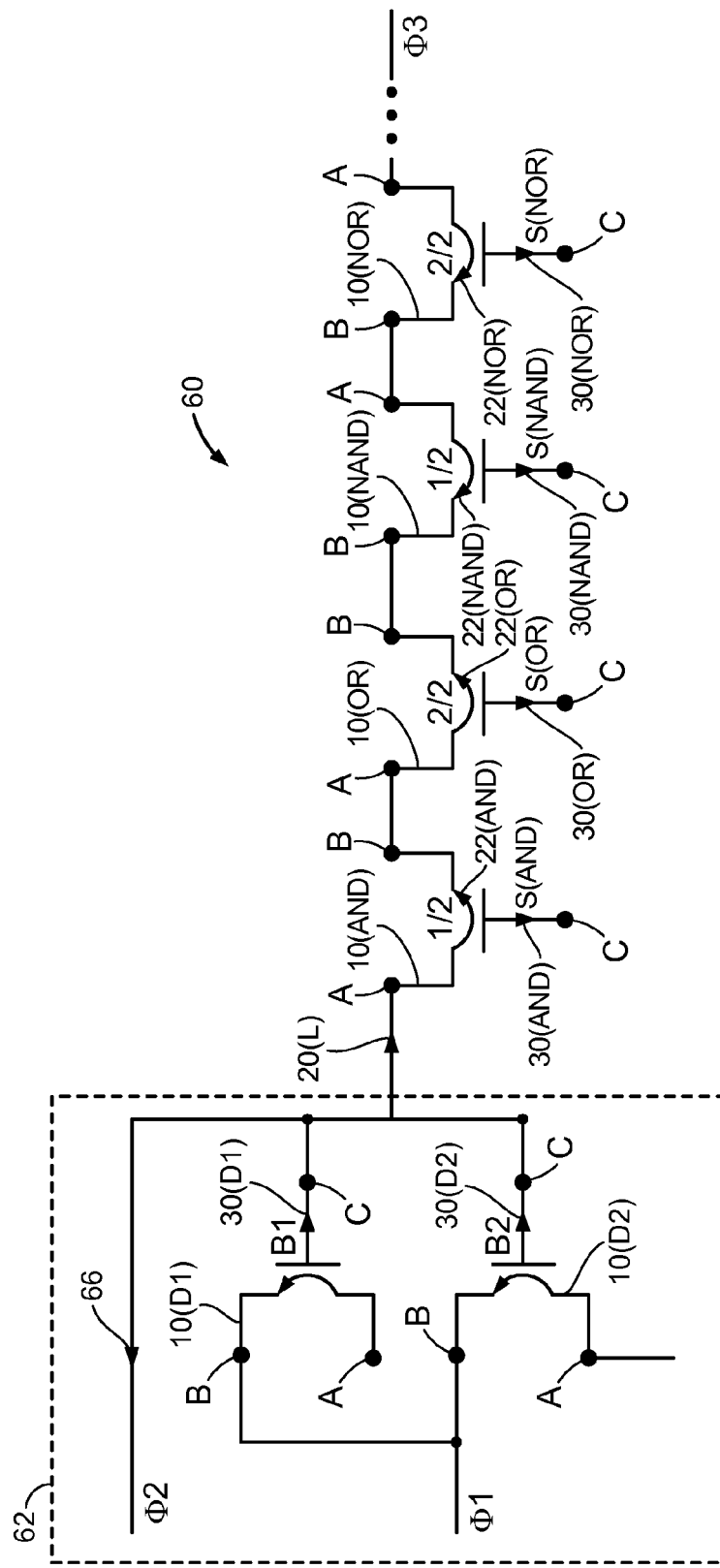
FIG. 8 illustrates one aspect of a spintronic logic gate which may be utilized to perform logical operations.

FIG. 8 illustrates one aspect of a spintronic logic gate 60 which may be utilized to perform logical operations, such as an AND operation, an OR operation, a NOR operation, or a NAND operation. The spintronic logic gate 60 includes a charge current generation circuit 62 and GSHE MTJ elements 10(AND), 10(OR), 10(NAND), and 10(NOR), each of which is an aspect of the GSHE MTJ element 10 described above with respect to FIG. 1. Thus, each of the GSHE MTJ elements 10(AND), 10(OR), 10(NAND), and 10(NOR) includes one aspect of the charge current node A, the charge current node B, and the charge current node C. As explained in further detail below, the logical operation performed by each of the GSHE MTJ elements 10(AND), 10(OR), 10(NOR), and 10(NAND) is determined by appropriately connecting the charge current nodes A, B and by selecting appropriate integer values for the integers n, m. The integer n of each is equal to two (2). Each of the GSHE MTJ elements 10(AND), 10(OR), 10(NAND), and 10(NOR) has a threshold current level, which is indicated by the integer m. The integer m of the GSHE MTJ element 10(AND) is equal to one (1), the integer m of the GSHE MTJ element 10(OR) is equal to two (2), the integer m of the GSHE MTJ element 10(NAND) is equal to one (1), and the integer m of the GSHE MTJ element 10(NOR) is equal to two (2). It should be noted that throughout the description of the figures, a logical value of "0" for a bit state is represented by the parallel magnetic orientation alignment state, the low resistive state, and the high current magnitude, while a logical value of "1" for the bit state is represented by the anti-parallel magnetic orientation alignment state, the high resistive state, and the low current magnitude.

The charge current generation circuit 62 is configured to generate a charge current 20(L) representing an input bit set. The input bit set may include one or more input bit states for the logical operations performed by each of the GSHE MTJ elements 10(AND), 10(OR), 10(NAND), and 10(NOR). In this aspect, the charge current generation circuit 62 may be further configured to store the input bit set. With regard to the charge current generation circuit 62 shown in FIG. 8, the charge current generation circuit 62 is configured to store two input bit states in the input bit set and to generate the charge current 20(L) such that the charge current 20(L) represents the two input bit states in the input bit set.

To store the input bit set and generate the charge current 20(L), the charge current generation circuit 62 may include a set of one or more MTJ elements. In this aspect, the charge current generation circuit 62 includes a GSHE MTJ element 10(D1) and a GSHE MTJ element 10(D2), each of which is an aspect of the GSHE MTJ element 10 described above with respect to FIG. 1. Thus, each of the GSHE MTJ elements 10(D1) and 10(D2) includes one aspect of the charge current node A, the charge current node B, and the charge current node C. The GSHE MTJ element 10(D1) is configured to store a first input bit state of the input bit set, while the GSHE MTJ element 10(D2) is configured to store a second input bit state of the input bit set. In one aspect, the first input bit state and the second input bit state may be set by charge currents (not shown) that represent the first input bit state and the second input bit state. For example, a write voltage representing the first input bit state may be applied between the charge current node A and the charge current node B of the GSHE MTJ element 10(D1). As such, a charge current (not shown) representing the first input bit state may be generated in response to the write voltage, thereby setting the first input bit state stored by the GSHE MTJ element 10(D1). Similarly, a write voltage representing the second input bit state may be applied between the charge current node A and the charge current node B of the GSHE MTJ element 10(D2). As such, a charge current (not shown) representing the second input bit state may be generated in response to the write voltage, thereby setting the second input bit state stored by the GSHE MTJ element 10(D2).

The GSHE MTJ element 10(D1) and the GSHE MTJ element 10(D2) in the charge current generation circuit 62 are operably associated such that the GSHE MTJ element 10(D1) and the GSHE MTJ element 10(D2) generate the charge current 20(L) that represents both the first input bit state and the second input bit state of the input bit set. In the aspect of the charge current generation circuit 62 shown in FIG. 8, the GSHE MTJ element 10(D1) and the GSHE MTJ element 10(D2) are coupled in parallel. To generate the charge current 20(L), the GSHE MTJ element 10(D1) is configured to generate a charge current 30(D1) that represents the first input bit state, and the GSHE MTJ element 10(D2) is configured to generate a charge current 30(D2) that represents the second input bit state. The charge current 30(D1) is generated from the charge current node C of the GSHE MTJ element 10(D1) and the charge current 30(D2) is generated from the charge current node C of the GSHE MTJ element 10(D2). The charge current node C of the GSHE MTJ element 10(D1) and the charge current node C of the GSHE MTJ element 10(D2) are connected to one another. As such, the charge current 30(D1) and the charge current 30(D2) combine to provide the charge current 20(L). The GSHE MTJ element 10(D1) and the GSHE MTJ element 10(D2) are thus coupled such that the charge current 20(L) includes the charge current 30(D1) and the charge current 30(D2). As such, the charge current 20(L) simultaneously represents the first input bit state and the second input bit state of the input bit set.

For example, assume that both the GSHE MTJ element 10(D1) and the GSHE MTJ element 10(D2) are in the parallel magnetic orientation alignment state, and thus the first input bit state and the second input bit state both have a logical value of "0." If the charge current 30(D1) and the charge current 30(D2) both have the high current magnitude, a charge current magnitude of the charge current 20(L) will be provided in a high current state. The charge current 20(L) thus represents the logical values of "00."

Alternatively, if the GSHE MTJ element 10(D1) is in the parallel magnetic orientation alignment state and the GSHE MTJ element 10(D2) is in the anti-parallel magnetic orientation alignment state, the first input bit state has a logical value of "0" and the second input bit state has a logical value of "1." In this case, the charge current 30(D1) has the high current magnitude and the charge current 30(D2) has the low current magnitude. The charge current 30(D1) thus represents the first input bit state having a logical value of "0" and the charge current 30(D2) thus represents the second input bit state having a logical value of "1." Additionally, if the GSHE MTJ element 10(D1) is in the anti-parallel magnetic orientation alignment state and the GSHE MTJ element 10(D2) is in the parallel magnetic orientation alignment state, the first input bit state has a logical value of "1" and the second input bit state has a logical value of "0." The charge current 30(D1) thus represents the first input bit state having a logical value of "1." Additionally, the charge current 30(D2) represents the second input bit state having a logical value of "0." If one of the charge currents 30(D1), 30(D2) has the high current magnitude and the other of the charge currents 30(D1), 30(D2) has the low current magnitude, the charge current magnitude of the charge current 20(L) will be in a medium current state. The charge current 20(L) thus represents the logical value of "01" or the logical value of "10."

Finally, assume that both the GSHE MTJ element 10(D1) and the GSHE MTJ element 10(D2) are in the anti-parallel magnetic orientation alignment state and thus the first input bit state and the second input bit state both have a logical value of "1." If the charge current 30(D1) and the charge current 30(D2) both have the low current magnitude, the charge current magnitude of the charge current 20(L) will be provided in a low current state. The charge current 20(L) thus represents the logical value of "11."

In this aspect, each of the GSHE MTJ elements 10(AND), 10(OR), 10(NAND), 10(NOR) is configured to set a logical output bit state for a logical operation and store the logical output bit state. More specifically, the GSHE MTJ element 10(AND) is configured to store and set a first logical output bit state for an AND operation. The GSHE MTJ element 10(AND) is configured to perform the AND operation through the arrangement of the charge current node A and the charge current node B of the GSHE MTJ element 10(AND) and through the selection of the integers m and n for the GSHE MTJ element 10(AND). The GSHE MTJ element 10(OR) is configured to store and set a second logical output bit state for an OR operation. The GSHE MTJ element 10(OR) is configured to perform the OR operation through the arrangement of the charge current node A and the charge current node B of the GSHE MTJ element 10(OR) and through the selection of the integers m and n for the GSHE MTJ element 10(OR). The GSHE MTJ element 10(NAND) is configured to store and set a third logical output bit state for a NAND operation. The GSHE MTJ element 10(NAND) is configured to perform the NAND operation through the arrangement of the charge current node A and the charge current node B of the GSHE MTJ element 10(NAND) and through the selection of the integers m and n for the GSHE MTJ element 10(NAND). Finally, the GSHE MTJ element 10(NOR) is configured to store and set a fourth logical output bit state for a NOR operation. The GSHE MTJ element 10(NOR) is configured to perform the NOR operation through the arrangement of the charge current node A and the charge current node B of the GSHE MTJ element 10(NOR) and through the selection of the integers m and n for the GSHE MTJ element 10(NOR).

The GSHE MTJ elements 10(AND), 10(OR), 10(NAND), 10(NOR) shown in FIG. 8 are each coupled in series. Thus, each of the GSHE MTJ elements 10(AND), 10(OR), 10(NAND), 10(NOR) is configured to receive the charge current 20(L), which represents the input bit set as described above. The integer n of each of the GSHE MTJ elements 10(AND), 10(OR), 10(NAND), 10(NOR) is two (2), since the charge current generation circuit 62 has two MTJ input nodes provided by the GSHE MTJ element 10(D1) and the GSHE MTJ element 10(D2). As such, the input bit set from the charge current generation circuit 62 has two input bit states: the first input bit state stored by the GSHE MTJ element 10(D1) and the second input bit state stored by the GSHE MTJ element 10(D2). To describe the logical operations performed by the GSHE MTJ elements 10(AND), 10(OR), 10(NAND), 10(NOR), assume that the first logical output bit state stored by the GSHE MTJ element 10(AND) has been preset to have a logical value of "1" (i.e., the anti-parallel magnetic orientation alignment), the second logical output bit state stored by the GSHE MTJ element 10(OR) has been preset to have a logical value of "1" (i.e., the anti-parallel magnetic orientation alignment), the third logical output bit state stored by the GSHE MTJ element 10(NAND) has been preset to have a logical value of "0" (i.e., the parallel magnetic orientation alignment), and the fourth logical output bit state stored by the GSHE MTJ element 10(NOR) has been preset to have a logical value of "0" (i.e., the parallel magnetic orientation alignment). In the illustrated case where the GSHE MTJ elements 10(AND), 10(OR), 10(NAND), 10(NOR) are connected in series, an assumed preset can be accomplished by transmitting an initial charge current 20(L), shown as the preset current 66, from the charge current node A of the GSHE MTJ element 10(NOR) to the charge current node A of the GSHE MTJ element 10(AND). Establishing the preset current 66 can be accomplished by appropriately setting the control signals D3 and D2, as will be further explained below. It is noted that the preset current 66, may potentially flow back into the charge current generation circuit 62 in a reverse direction, which leads to incorrect operation of the spintronic logic gate 60. Exemplary aspects discussed below include techniques to prevent the preset current 66 from flowing back into the charge current generation circuit 62 in an incorrect manner.

Once the logical output bit states have been established with the preset currents, the operation of spintronic logic gate 60 of FIG. 8 proceeds as follows. The charge current 20(L) is received by the GSHE MTJ element 10(AND) at the charge current node A of the GSHE MTJ element 10(AND). The GSHE MTJ element 10(AND) is configured to generate a GSHE spin current 22(AND) in response to the charge current 20(L). More specifically, the GSHE MTJ element 10(AND) is configured to produce a GSHE that converts the charge current 20(L) into the GSHE spin current 22(AND). The GSHE MTJ element 10(AND) has a threshold current level indicated by the integer m of the GSHE MTJ element 10(AND), which has an integer value of one (1), and the integer n of the GSHE MTJ element 10(AND), which has an integer value of two (2).

The GSHE MTJ element 10(AND) is configured to perform the AND operation on the input bit set (i.e., a first input bit state B1 and a second input bit state B2) by setting a first logical output bit state S(AND) based on whether the GSHE spin current 22(AND) exceeds the threshold current level of the GSHE MTJ element 10(AND). More specifically, the GSHE spin current 22(AND) exceeds the threshold current level of the GSHE MTJ element 10(AND) when either or both of the first input bit state B1 and second input bit state B2 have a logical value of "0." When the GSHE spin current 22(AND) exceeds the threshold current level of the GSHE MTJ element 10(AND), the GSHE MTJ element 10(AND) is configured to switch the first logical output bit state S(AND) from the logical value of "1" (i.e., the anti-parallel magnetic orientation state, which was preset) to the logical value of "0" (i.e., the parallel magnetic orientation state) because the charge current 20(L) is received at the charge current node A. Otherwise, the GSHE spin current 22(AND) is below the threshold current level of the GSHE MTJ element 10(AND) when both the first input bit state B1 and the second input bit state B2 have the logical value of "1." When the GSHE spin current 22(AND) is below the threshold current level of the GSHE MTJ element 10(AND), the GSHE MTJ element 10(AND) is configured to maintain the first logical output bit state S(AND) at the logical value of "1" (i.e., the anti-parallel magnetic orientation state). At the charge current node B of the GSHE MTJ element 10(AND), the GSHE spin current 22(AND) is converted back into the charge current 20(L). To read the first logical output bit state S(AND), the GSHE MTJ element 10(AND) is configured to generate a charge current 30(AND) that represents the first logical output bit state S(AND) from the charge current node C of the GSHE MTJ element 10(AND).

The charge current 20(L) is received by the GSHE MTJ element 10(OR) at the charge current node A of the GSHE MTJ element 10(OR). The GSHE MTJ element 10(OR) is configured to generate a GSHE spin current 22(OR) in response to the charge current 20(L). More specifically, the GSHE MTJ element 10(OR) is configured to produce a GSHE that converts the charge current 20(L) into the GSHE spin current 22(OR). The GSHE MTJ element 10(OR) has a threshold current level indicated by the integer m of the GSHE MTJ element 10(OR), which has an integer value of two (2), and the integer n of the GSHE MTJ element 10(OR), which has an integer value of two (2).

The GSHE MTJ element 10(OR) is configured to perform the OR operation on the input bit set (i.e., the first input bit state B1 and the second input bit state B2) by setting a second logical output bit state S(OR) based on whether the GSHE spin current 22(OR) exceeds the threshold current level of the GSHE MTJ element 10(OR). More specifically, the GSHE spin current 22(OR) exceeds the threshold current level of the GSHE MTJ element 10(OR) when both the first input bit state B1 and second input bit state B2 have a logical value of "0." When the GSHE spin current 22(OR) exceeds the threshold current level of the GSHE MTJ element 10(OR), the GSHE MTJ element 10(OR) is configured to switch the second logical output bit state S(OR) from the logical value of "1" (i.e., the anti-parallel magnetic orientation state) to the logical value of "0" (i.e., the parallel magnetic orientation state) because the charge current 20(L) is received at the charge current node A. Otherwise, the GSHE spin current 22(OR) is below the threshold current level of the GSHE MTJ element 10(OR) when either or both of the first input bit state B1 and the second input bit state B2 have the logical value of "1." When the GSHE spin current 22(OR) is below the threshold current level of the GSHE MTJ element 10(OR), the GSHE MTJ element 10(OR) is configured to maintain the second logical output bit state S(OR) at the logical value of "1" (i.e., the anti-parallel magnetic orientation state). At the charge current node B of the GSHE MTJ element 10(OR), the GSHE spin current 22(OR) is converted back into the charge current 20(L). To read the second logical output bit state S(OR), the GSHE MTJ element 10(OR) is configured to generate a charge current 30(OR) that represents the second logical output bit state S(OR) from the charge current node C of the GSHE MTJ element 10(OR).

Next, the charge current 20(L) is received by the GSHE MTJ element 10(NAND) at the charge current node B of the GSHE MTJ element 10(NAND). The GSHE MTJ element 10(NAND) is configured to generate a GSHE spin current 22(NAND) in response to the charge current 20(L). More specifically, the GSHE MTJ element 10(NAND) is configured to produce a GSHE that converts the charge current 20(L) into the GSHE spin current 22(NAND). The GSHE MTJ element 10(NAND) has a threshold current level indicated by the integer m of the GSHE MTJ element 10, which has an integer value of one (1), and the integer n of the GSHE MTJ element 10(NAND), which has an integer value of two (2).

The GSHE MTJ element 10(NAND) is configured to perform the NAND operation on the input bit set (i.e., the first input bit state B1 and the second input bit state B2) by setting a third logical output bit state S(NAND) based on whether the GSHE spin current 22(NAND) exceeds the threshold current level of the GSHE MTJ element 10(NAND). More specifically, the GSHE spin current 22(NAND) exceeds the threshold current level of the GSHE MTJ element 10(NAND) when either or both of the first input bit state B1 and second input bit state B2 have a logical value of "0." When the GSHE spin current 22(NAND) exceeds the threshold current level of the GSHE MTJ element 10(NAND), the GSHE MTJ element 10(NAND) is configured to switch the third logical output bit state S(NAND) from the logical value of "0" (i.e., the parallel magnetic orientation state) to the logical value of "1" (i.e., the anti-parallel magnetic orientation state) because the charge current 20(L) is received at the charge current node B. Otherwise, the GSHE spin current 22(NAND) is below the threshold current level of the GSHE MTJ element 10(NAND) when both the first input bit state B1 and the second input bit state B2 have the logical value of "1." When the GSHE spin current 22(NAND) is below the threshold current level of the GSHE MTJ element 10(NAND), the GSHE MTJ element 10(NAND) is configured to maintain the third logical output bit state S(NAND) at the logical value of "0" (i.e., the parallel magnetic orientation state). At the charge current node A of the GSHE MTJ element 10(NAND), the GSHE spin current 22(NAND) is converted back into the charge current 20(L). To read the third logical output bit state S(NAND), the GSHE MTJ element 10(NAND) is configured to generate a charge current 30(NAND) that represents the third logical output bit state S(NAND) from the charge current node C of the GSHE MTJ element 10(NAND).

Finally, the charge current 20(L) is received by the GSHE MTJ element 10(NOR) at the charge current node B of the GSHE MTJ element 10(NOR). The GSHE MTJ element 10(NOR) is configured to generate a GSHE spin current 22(NOR) in response to the charge current 20(L). More specifically, the GSHE MTJ element 10(NOR) is configured to produce a GSHE that converts the charge current 20(L) into the GSHE spin current 22(NOR). The GSHE MTJ element 10(NOR) has a threshold current level indicated by the integer m of the GSHE MTJ element 10(NOR), which has an integer value of two (2), and the integer n of the GSHE MTJ element 10(NOR), which has an integer value of two (2).

The GSHE MTJ element 10(NOR) is configured to perform the NOR operation on the input bit set (i.e., the first input bit state B1 and the second input bit state B2) by setting a fourth logical output bit state S(NOR) based on whether the GSHE spin current 22(NOR) exceeds the threshold current level of the GSHE MTJ element 10(NOR). More specifically, the GSHE spin current 22(NOR) exceeds the threshold current level of the GSHE MTJ element 10(NOR) when both the first input bit state B1 and second input bit state B2 have a logical value of "0." When the GSHE spin current 22(NOR) exceeds the threshold current level of the GSHE MTJ element 10(NOR), the GSHE MTJ element 10(NOR) is configured to switch the fourth logical output bit state S(NOR) from the logical value of "0" (i.e., the parallel magnetic orientation state) to the logical value of "1" (i.e., the anti-parallel magnetic orientation state) because the charge current 20(L) is received at the charge current node B. Otherwise, the GSHE spin current 22(NOR) is below the threshold current level of the GSHE MTJ element 10(NOR) when either the first input bit state B1 or the second input bit state B2 has the logical value of "1." When the GSHE spin current 22(NOR) is below the threshold current level of the GSHE MTJ element 10(NOR), the GSHE MTJ element 10(NOR) is configured to maintain the fourth logical output bit state S(NOR) at the logical value of "0" (i.e., the parallel magnetic orientation state). At the charge current node A of the GSHE MTJ element 10(NOR), the GSHE spin current 22(NOR) is converted back into the charge current 20(L). To read the fourth logical output bit state S(NAND), the GSHE MTJ element 10(NOR) is configured to generate a charge current 30(NAND) that represents the fourth logical output bit state S(NOR) from the charge current node C of the GSHE MTJ element 10(NOR).

As explained in further detail below, the spintronic logic gate 60 is configured to receive a control signal Φ1, a control signal Φ2, and a control signal Φ3 in order to synchronize the operations of the GSHE MTJ elements 10(D1), 10(D2), 10(AND), 10(OR), 10(NAND), 10(NOR). In this manner, the bit states B1, B2, S(AND), S(OR), S(NOR), S(NAND) are updated in a synchronized manner. Note that the magnetic orientation alignments and resistances of the GSHE MTJ elements 10(AND), 10(OR), 10(NAND), and 10(NOR) can be used to store results of their respective logical operations without requiring separate sequential logic elements.

By providing the GSHE MTJ elements 10(D1), 10(D2) of the charge current generation circuit 62 in parallel, drive voltages to the GSHE MTJ elements 10(D1), 10(D2) do not have to be so high. However, when the GSHE MTJ elements 10(D1), 10(D2) are connected in parallel, the charge current generation circuit 62 may have reduced fanout performance since an input resistance of the charge current generation circuit 62 is reduced. Also, in this aspect, the GSHE MTJ elements 10(AND), 10(OR), 10(NAND), and 10(NOR) are coupled in series. The series arrangement provides for better fanout since the charge current 20 does not have to be increased due to the series arrangement when a number of the GSHE MTJ elements 10(AND), 10(OR), 10(NAND), and 10(NOR) that perform logical operations increases. However, the series arrangement also may require that higher drive voltages be provided to the GSHE MTJ elements 10(AND), 10(OR), 10(NAND), and 10(NOR).

Figures 9, 10:
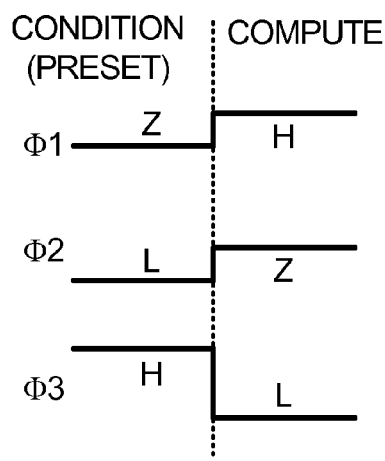
FIG. 9 illustrates a group of truth tables representing the logical operations performed by the spintronic logic gate shown in FIG. 8.
FIG. 10 illustrates a timing diagram representing control states of control signals used to synchronize and preset the spintronic logic gate shown in FIG. 8.

Referring now to FIGS. 8 and 9, FIG. 9 illustrates a group of truth tables T(AND), T(OR), T(NAND), and T(NOR) that collectively represent the logical operations performed by the GSHE MTJ elements 10(AND), 10(OR), 10(NAND), and 10(NOR) in the spintronic logic gate 60 shown in FIG. 8. The logical operations of the truth tables T(AND), T(OR), T(NAND), AND T(NOR) assume that the GSHE MTJ element 10(AND) has been preset to have a logical value of "1," the GSHE MTJ element 10(OR) has been preset to have a logical value of "1," the GSHE MTJ element 10(NAND) has been preset to have a logical value of "0," and the GSHE MTJ element 10(NOR) has been preset to have a logical value of "0."

Referring now to FIGS. 8 and 10, FIG. 10 illustrates a timing diagram representing a control state of the control signal Φ1, a control state of the control signal Φ2, and a control state of the control signal Φ3. A control state of H represents a high voltage state, a control state of L represents a low voltage state, and a control state of Z represents a high impedance state. During a preset mode, the control signal Φ1 is in the control state Z, the control signal Φ2 is in the control state L, and the control signal Φ3 is in the control state H. As such, a preset charge current 66 (shown in FIG. 8) is generated, propagating from the control signal Φ3 to the control signal Φ2. Note that the charge current 20(L) propagates in a first current direction across the GSHE MTJ elements 10(AND), 10(OR), 10(NAND), and 10(NOR), while the preset charge current 66 propagates in a second current direction across the GSHE MTJ elements 10(AND), 10(OR), 10(NAND), and 10(NOR), wherein the second current direction is antipodal to the first current direction and also referred to herein as a "reverse direction." In this manner, the logical output bit states S(AND), S(OR), S(NAND), and S(NOR) of the GSHE MTJ elements 10(AND), 10(OR), 10(NAND), and 10(NOR) are preset to have logical values of "1," "1," "0," and "0," respectively. These are the default logical values of the logical output bit states S(AND), S(OR), S(NAND), and S(NOR). The first input bit state B1 and the second input bit state B2 of the GSHE MTJ elements 10(D1), 10(D2) may be set prior to the preset mode by write voltages. In alternative aspects, the first input bit state B1 and the second input bit state B2 may be set during the preset mode.

During a compute mode, the control signal Φ1 is in the control state H, the control signal D2 is in the control state Z, and the control signal Φ3 is in the control state L. As such, the charge current 20(L) is generated in order to read the first input bit state B1 and the second input bit state B2 stored by the charge current generation circuit 62, and to perform the logical operations of the GSHE MTJ elements 10(AND), 10(OR), 10(NAND), and 10(NOR) described above with respect to FIG. 8.

Figure 11:
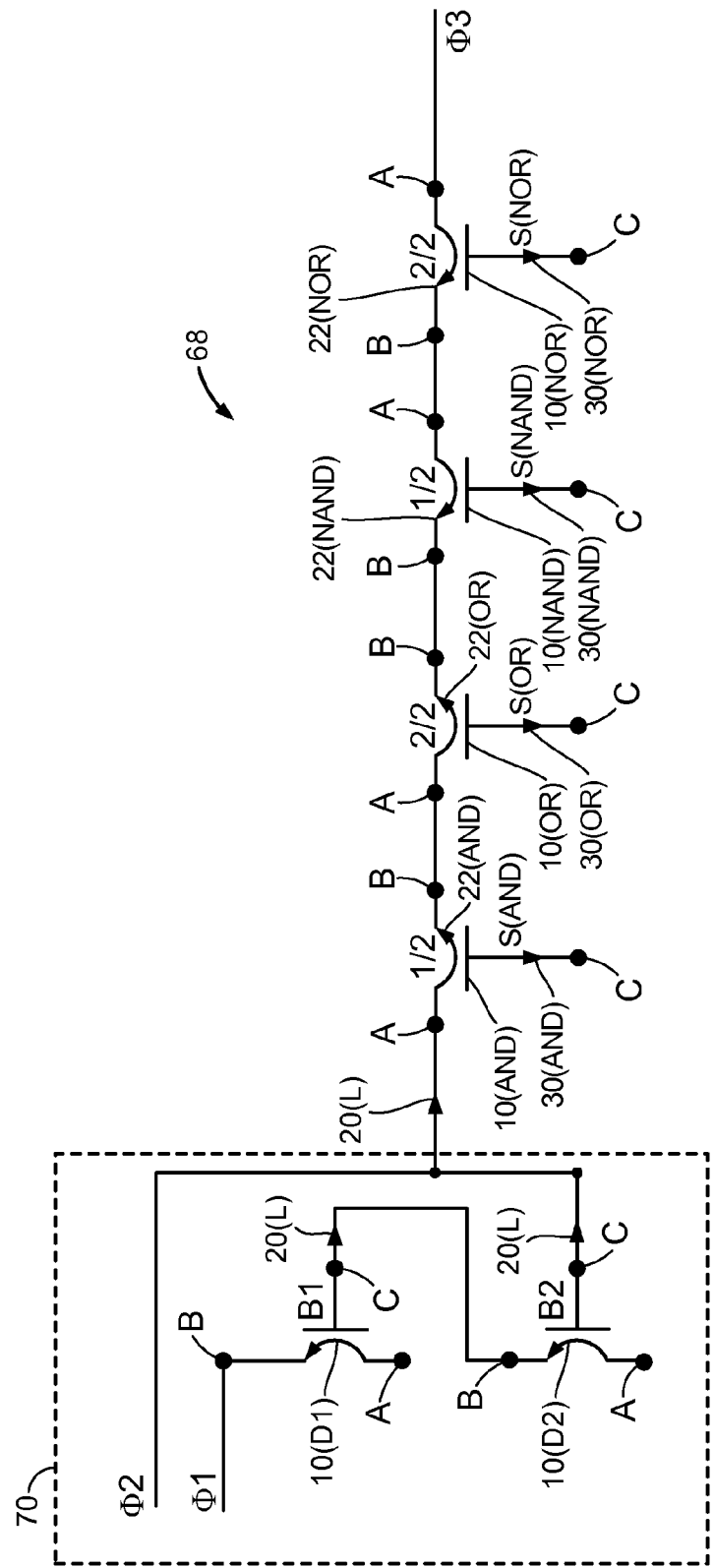
FIG. 11 illustrates another aspect of a spintronic logic gate which may be utilized to perform logical operations.

FIG. 11 illustrates another aspect of a spintronic logic gate 68. The spintronic logic gate 68 includes a charge current generation circuit 70 and the GSHE MTJ elements 10(AND), 10(OR), 10(NAND), and 10(NOR) described above with respect to FIG. 8. The GSHE MTJ elements 10(AND), 10(OR), 10(NAND), and 10(NOR) are also coupled in series in the same manner described above with respect to FIG. 8. Like the charge current generation circuit 62 illustrated in FIG. 8, the charge current generation circuit 70 includes the GSHE MTJ elements 10(D1), 10(D2) and is configured to generate the charge current 20(L) representing first input bit state B1 and the second input bit state B2. More specifically, the GSHE MTJ elements 10(D1) and the 10(D2) are operably associated so as to generate the charge current 20(L). However, the GSHE MTJ elements 10(D1), 10(D2) shown in FIG. 11 are coupled in series. Accordingly, the charge current node C of the GSHE MTJ element 10(D1) is connected to the charge current node B of the GSHE MTJ element 10(D2). Thus, the GSHE MTJ element 10(D1) and the GSHE MTJ element 10(D2) are coupled so that the charge current 20(L) propagates from the GSHE MTJ element 10(D1) and the GSHE MTJ element 10(D2). In this aspect, the charge current 20(L) propagates from the charge current node C of the GSHE MTJ element 10(D1) to the charge current node B of the GSHE MTJ element 10(D2). The charge current 20(L)

then propagates from the charge current node C of the GSHE MTJ element 10(D2) to the GSHE MTJ elements 10(AND), 10(OR), 10(NAND), and 10(NOR). In comparison to the charge current generation circuit 62 of FIG. 8, the charge current generation circuit 70 may have a better fanout since connecting the GSHE MTJ elements 10(D1), 10(D2) in series increases the input resistance of the charge current generation circuit 70.

Figure 12:
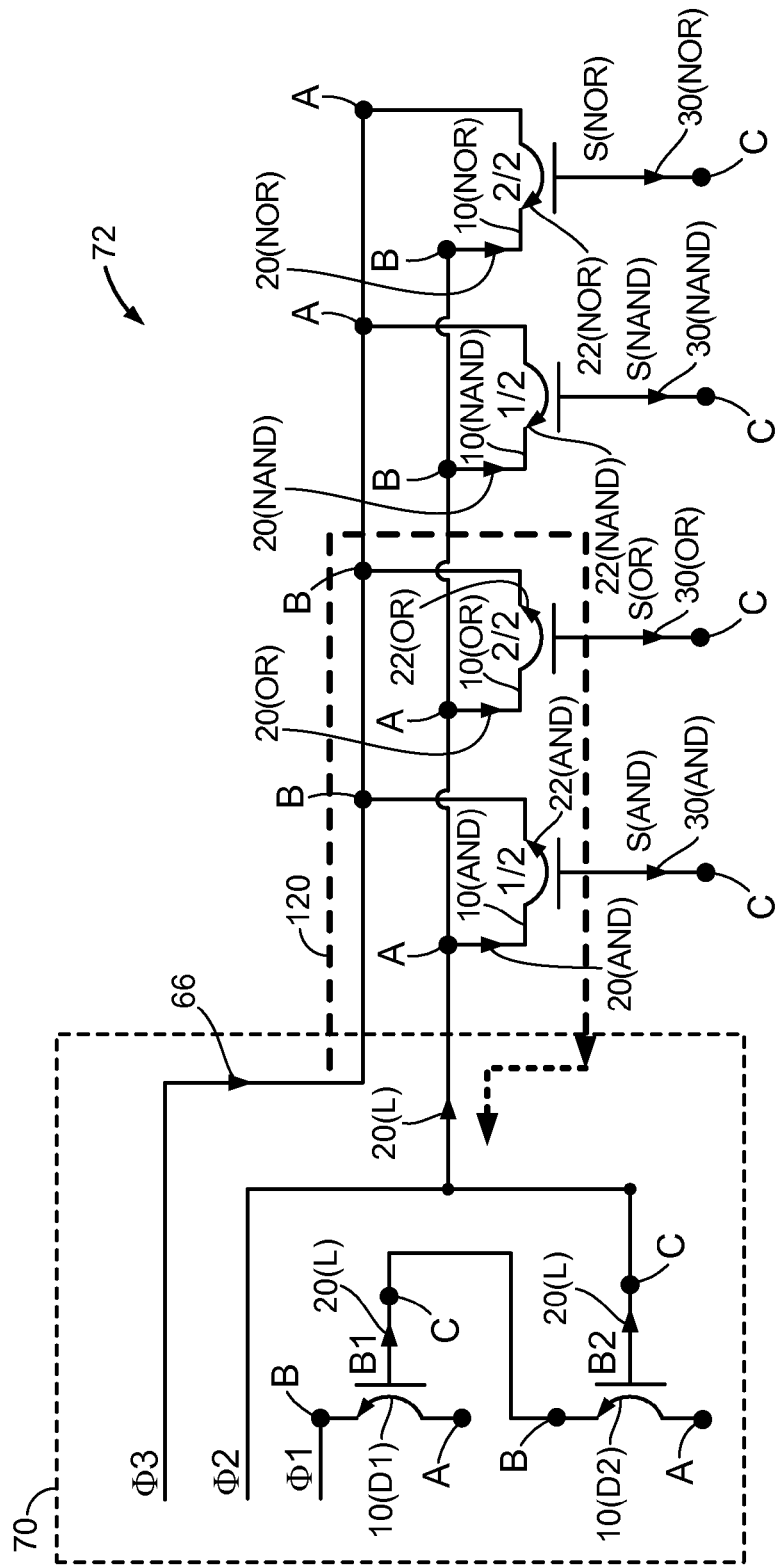
FIG. 12 illustrates yet another aspect of a spintronic logic gate which may be utilized to perform logical operations.

FIG. 12 illustrates another aspect of a spintronic logic gate 72. The spintronic logic gate 72 includes the charge current generation circuit 70 described above with respect to FIG. 11 and the GSHE MTJ elements 10(AND), 10(OR), 10(NAND), and 10(NOR) described above with respect to FIG. 8. Each of the GSHE MTJ elements 10(AND), 10(OR), 10(NAND), and 10(NOR) is configured to generate the GSHE spin currents 22(AND), 22(OR), 22(NAND), and 22(NOR), respectively, in response to the charge current 20(L). However, in this aspect, the GSHE MTJ elements 10(AND), 10(OR), 10(NAND), and 10(NOR) are coupled in parallel. The parallel connection gives rise to the reverse current path such as a sneak path 120, through which the preset current 66 from the control signal Φ3 to the control signal Φ2 may flow back to input bit states B1/B2. In exemplary aspects described below, the sneak path 120 can be eliminated.

As such, in FIG. 12, the GSHE MTJ element 10(AND) is configured to receive a charge current 20(AND) at the charge current node A. The charge current 20(AND) is a portion of the charge current 20(L). Since the charge current 20(AND) is proportional to the charge current 20(L), the charge current 20(AND) also represents the first input bit state B1 and the second input bit state B2. The GSHE MTJ element 10(AND) is configured to produce the GSHE that converts the charge current 20(AND) to the GSHE spin current 22(AND). As described above, the GSHE MTJ element 10(AND) is configured to perform the AND operation based on whether the GSHE spin current 22(AND) exceeds the threshold current level of the GSHE MTJ element 10(AND).

Additionally, the GSHE MTJ element 10(OR) is configured to receive a charge current 20(OR) at the charge current node A. The charge current 20(OR) is a portion of the charge current 20(L). Since the charge current 20(OR) is proportional to the charge current 20(L), the charge current 20(OR) also represents the first input bit state B1 and the second input bit state B2. The GSHE MTJ element 10(OR) is configured to produce the GSHE that converts the charge current 20(OR) to the GSHE spin current 22(OR). As described above, the GSHE MTJ element 10(OR) is configured to perform the OR operation based on whether the GSHE spin current 22(OR) exceeds the threshold current level of the GSHE MTJ element 10(OR).

Furthermore, the GSHE MTJ element 10(NAND) is configured to receive a charge current 20(NAND) at the charge current node B. The charge current 20(NAND) is a portion of the charge current 20(L). Since the charge current 20(NAND) is proportional to the charge current 20(L), the charge current 20(NAND) also represents the first input bit state B1 and the second input bit state B2. The GSHE MTJ element 10(NAND) is configured to produce the GSHE that converts the charge current 20(NAND) to the GSHE spin current 22(NAND). As described above, the GSHE MTJ element 10(NAND) is configured to perform the NOR operation based on whether the GSHE spin current 22(NAND) exceeds the threshold current level of the GSHE MTJ element 10(NAND).

Finally, the GSHE MTJ element 10(NOR) is configured to receive a charge current 20(NOR) at the charge current node B. The charge current 20(NOR) is a portion of the charge current 20(L). Since the charge current 20(NOR) is proportional to the charge current 20(L), the charge current 20(NOR) also represents the first input bit state B1 and the second input bit state B2. The GSHE MTJ element 10(NOR) is configured to produce the GSHE that converts the charge current 20(NOR) to the GSHE spin current 22(NOR). As described above, the GSHE MTJ element 10(NOR) is configured to perform the NAND operation based on whether the GSHE spin current 22(NOR) exceeds the threshold current level of the GSHE MTJ element 10(NOR). By being coupled in parallel, the GSHE MTJ elements 10(AND), 10(OR), 10(NAND), and 10(NOR) may receive lower drive voltages but may have reduced fanout performance due to a high current demand with regard to the charge current 20(L).

Figure 13:
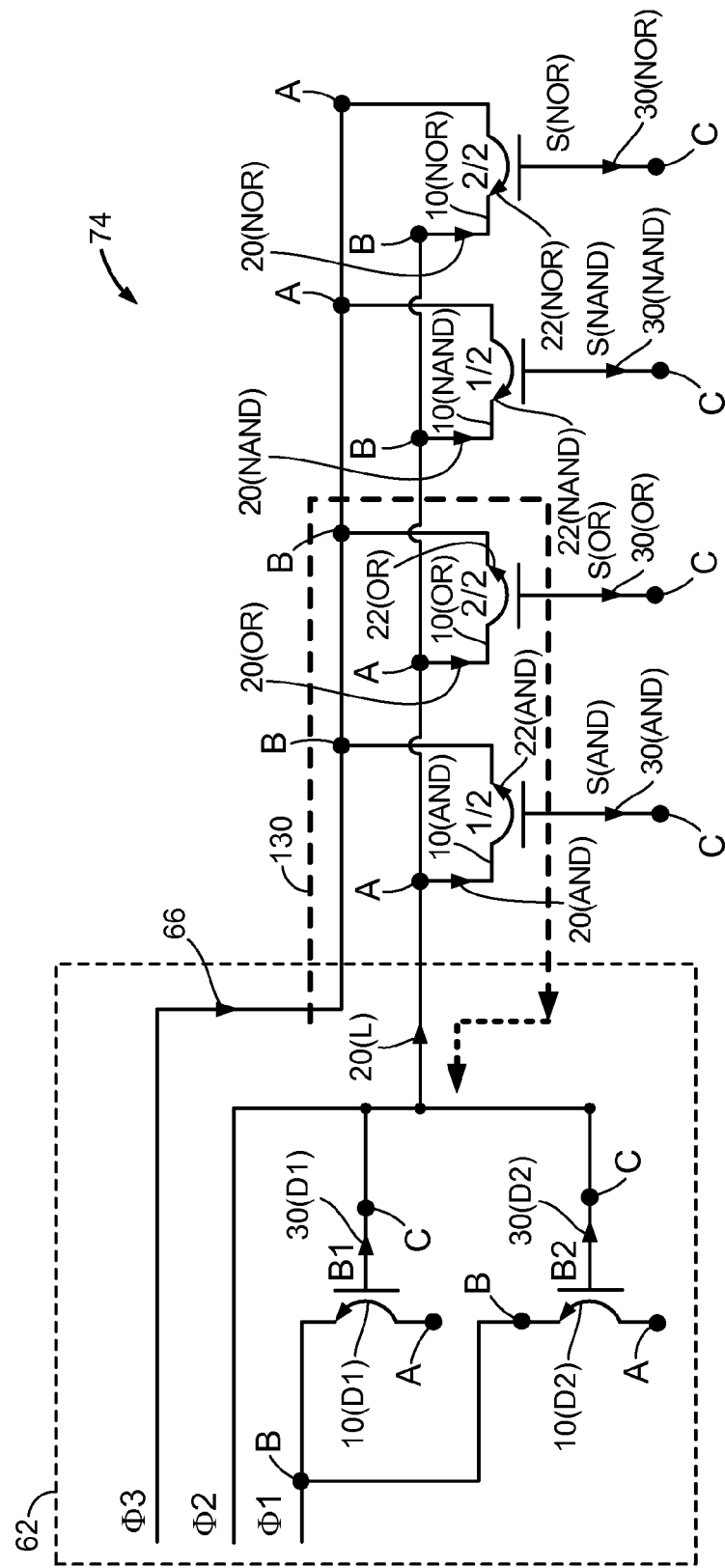
FIG. 13 illustrates yet another aspect of a spintronic logic gate which may be utilized to perform logical operations.

FIG. 13 illustrates another aspect of a spintronic logic gate 74. The spintronic logic gate 74 includes the charge current generation circuit 62 described above with respect to FIG. 8 and the GSHE MTJ elements 10(AND), 10(OR), 10(NAND), and 10(NOR). In this aspect, the GSHE MTJ elements 10(AND), 10(OR), 10(NAND), and 10(NOR) are coupled in parallel as described above in FIG. 12. As such, in comparison to the spintronic logic gate 60 shown in FIG. 8, the spintronic logic gate 68 shown in FIG. 11, and the spintronic logic gate 72 shown in FIG. 12, drive voltages to the spintronic logic gate 74 shown in FIG. 13 may be at their lowest. However, the spintronic logic gate 74 may have the worst fanout performance. Moreover, once again, the parallel connection may create a reverse current path such as a sneak path 130, through which the preset current 66 may flow back to input bit states B1/B2. In exemplary aspects described below, the sneak path 130 can be eliminated.

Figure 14A:
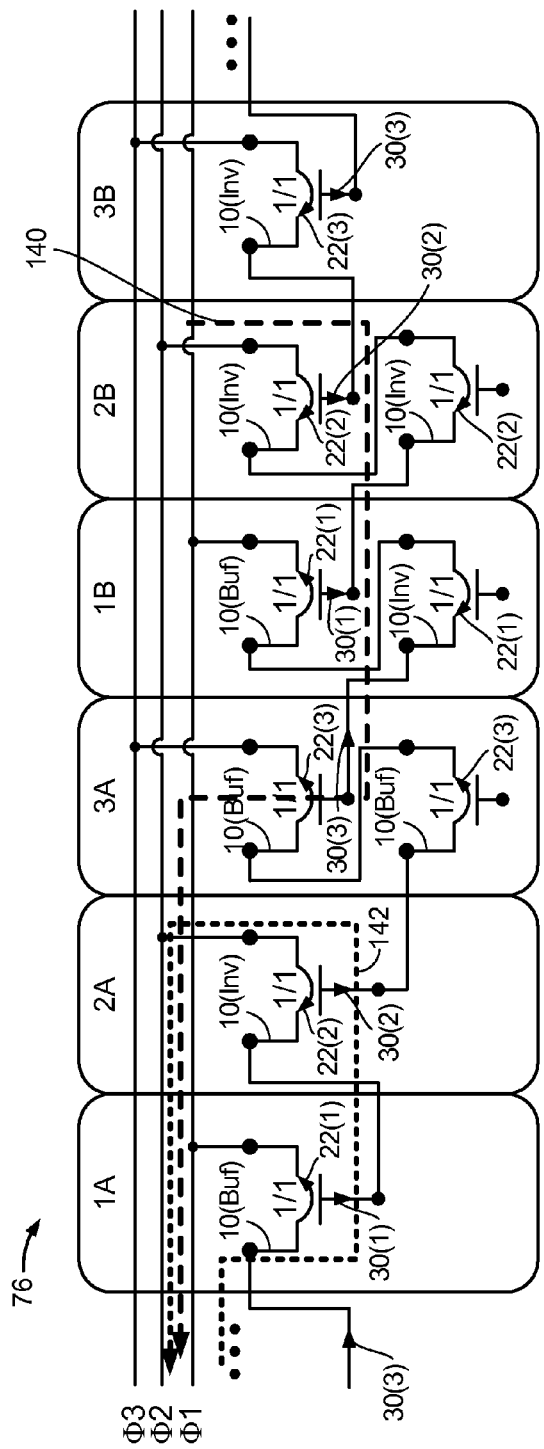
FIG. 14A illustrates one aspect of a pipeline circuit that includes pipeline stages with MTJ elements configured to perform buffering operations and inversion operations.
Figure 14B:
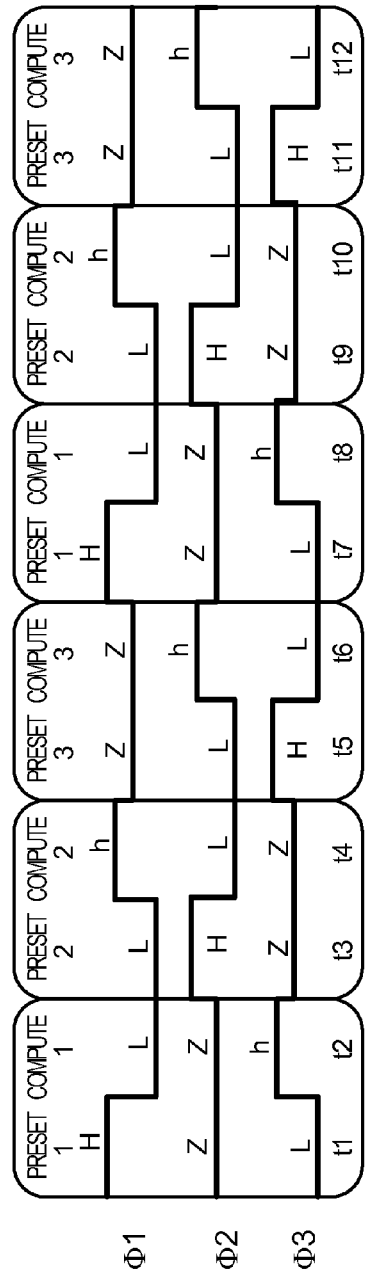
FIG. 14B illustrates a timing diagram representing control states of control signals used to synchronize and preset the pipeline circuit shown in FIG. 14A.

Referring now to FIGS. 14A and 14B, FIG. 14A illustrates one aspect of a pipeline circuit 76. The pipeline circuit 76 includes one or more pipeline stages 1A and 1B (referred to generically as pipeline stages 1), pipeline stages 2A and 2B (referred to generically as pipeline stages 2), and pipeline stages 3A and 3B (referred to generically as pipeline stages 3). The pipeline stages 1, 2, and 3 are each configured to receive the control signal Φ1, the control signal Φ2, and the control signal Φ3 in order to synchronize the preset modes and the compute modes of each of the pipeline stages 1, 2, 3. GSHE MTJ elements 10(Buf) in FIG. 14A comprise aspects of the GSHE MTJ element 10 shown in FIG. 1, but are configured to perform a buffering operation by the depicted connection of the charge current nodes A, B and the selection of the integers m, n of each of the GSHE MTJ elements 10(Buf). GSHE MTJ elements 10(Inv) in FIG. 14A comprise aspects of the GSHE MTJ element 10 shown in FIG. 1, but are configured to perform an inversion operation by the depicted connection of the charge current nodes A, B and the selection of the integers m, n of each of the GSHE MTJ elements 10(Inv). In this regard, the integer n (see FIG. 5) of each of the GSHE MTJ elements 10(Buf) and the GSHE MTJ elements 10(Inv) is one (1). The integer m of each of the GSHE MTJ elements 10(Buf) and the MTJ elements 10(Inv) is also one (1).

As shown in FIGS. 14A and 14B, FIG. 14B illustrates a timing diagram that represents the control state of the control signal Φ1, the control state of the control signal Φ2, and the control state of the control signal Φ3. The control state H represents the high voltage state and the control state L represents the low voltage state. A voltage difference between the control state H and the control state L is set to produce charge current or preset current of sufficient current magnitude to preset any of the GSHE MTJ elements 10(Inv) and the GSHE MTJ elements 10(Buf) in the pipeline stages 1, 2, and 3 regardless of an integer value of the integer m provided by the GSHE MTJ elements 10(Inv) and the GSHE MTJ elements 10(Buf). However, as previously explained, the preset current may give rise to a sneak path. In addition, FIG. 14A illustrates yet another sneak path 140 which can arise due to write current flowing from one pipeline stage (e.g., pipeline stage 3A) to an unintended pipeline stage (e.g., pipeline stage 2B). Sneak path 140 and aspects of eliminating sneak path 140 will be explained in the following sections. The control state Z represents the high impedance state, while a control state h represents an intermediate high voltage state that is lower than the control state H but not sufficient to generate a current with a high enough current magnitude to switch the GSHE MTJ elements 10(Inv) and the GSHE MTJ elements 10(Buf) in the pipeline stages 1, 2, and 3. A voltage difference between the control state h and the control state L is set such that it generates a charge current of appropriate magnitude to allow the GSHE MTJ elements 10(Inv) and the GSHE MTJ elements 10(Buf) to perform their respective logic functions while not impacting bit states being stored by the GSHE MTJ elements 10(Inv) and the GSHE MTJ elements 10(Buf).

In a preset mode 1, the pipeline stages 1 are preset to default logical values. Next, in a compute mode 1, charge currents 30(3) are provided to the GSHE MTJ elements 10(Buf) and the GSHE MTJ elements 10(Inv) in the pipeline stages 1 so that the GSHE MTJ elements 10(Buf) and the GSHE MTJ elements 10(Inv) perform their corresponding logical operations. The pipeline stage 1A is provided with the charge current 30(3) from a previous pipeline stage (not shown). The pipeline stage 1B is provided the charge current 30(3) from the pipeline stage 3A. The charge current 30(3) from the pipeline stage 3B is provided to a subsequent pipeline stage 1 (not shown). Bit states from the pipeline stages 3 are thus read in the compute mode 1 and the GSHE MTJ elements 10(Buf) and the GSHE MTJ elements 10(Inv) perform their respective logical operations by generating GSHE spin currents 22(1), which set bit states stored by the GSHE MTJ elements 10(Buf) and the GSHE MTJ elements 10(Inv) in the pipeline stages 1. The pipeline stages 2 provide isolation to the pipeline stages 1 and 3 during both the preset mode 1 and the compute mode 1.

In a preset mode 2, the pipeline stages 2 are preset to default logical values. Next, in a compute mode 2, charge currents 30(1) are provided to the GSHE MTJ elements 10(Inv) in the pipeline stages 2 so that the GSHE MTJ elements 10(Inv) perform their inversion operations. The pipeline stage 2A is provided with the charge current 30(1) from the pipeline stage 1A. The pipeline stage 2B is provided with the charge current 30(1) from the pipeline stage 1B. The bit states from the pipeline stages 1 are thus read in the compute mode 2 and the GSHE MTJ elements 10(Inv) perform their respective inversion operations by generating GSHE spin currents 22(2), which set bit states stored by the GSHE MTJ elements 10(Inv) in the pipeline stages 2. The pipeline stages 3 provide isolation to the pipeline stages 1 and 2 during both the preset mode 2 and the compute mode 2.

In a preset mode 3, the pipeline stages 3 are preset to default logical values. Next, in a compute mode 3, charge currents 30(2) are provided to the GSHE MTJ elements 10(Buf) and the GSHE MTJ elements 10(Inv) in the pipeline stages 3 so that the GSHE MTJ elements 10(Buf) and the GSHE MTJ elements 10(Inv) perform their corresponding logical operations. The pipeline stage 3A is provided with the charge current 30(2) from the pipeline stage 2A. The pipeline stage 3B is provided with the charge current 30(2) from the pipeline stage 2B. The bit states from the pipeline stages 2 are thus read in the compute mode 3 and the GSHE MTJ elements 10(Buf) and the GSHE MTJ elements 10(Inv) in the pipeline stages 3 perform their respective logical operations by generating GSHE spin currents 22(3), which set the bit states stored by the GSHE MTJ elements 10(Buf) and the GSHE MTJ elements 10(Inv) in the pipeline states 3. The pipeline stages 1 provide isolation between the pipeline stages 2 and 3 during both the preset mode 3 and the compute mode 3.

With the above explanation of preset modes 1-3 and compute modes 1-3 in mind, the possibility of sneak paths arising will now be explained. With reference to FIG. 14B, it is seen that control signal Φ1 is high or in control state h and control signal Φ2 is low or in control state L during compute mode 2, for example. An example current path 142 is thus provided for charge currents 30(1) provided to GSHE MTJ elements 10(Inv) in pipeline stage 2 during compute mode 2. However, based on the integer values m and n of the GSHE MTJ elements in pipeline stage 3A, it is possible for the sneak path 140 to arise from the connection of GSHE MTJ element 10(Buf) in pipeline stage 2B to the control signal Φ1 (in control state h in compute mode 2) to cause charge current 30(2) to flow through control signal Φ2 (in control state L in compute mode 2) and incorrectly write the GSHE MTJ elements 10(Buf) in pipeline stage 2B.

Referring now to FIGS. 15A and 15B, FIG. 15A illustrates one aspect of a pipeline circuit 78. The pipeline circuit 78 includes pipeline stage 1', pipeline stage 2', and pipeline stage 3'. Each of the pipeline stages 1', 2', and 3' is configured to receive the control signal Φ1, the control signal Φ2, and the control signal Φ3 in order to synchronize the preset modes and the compute modes of the pipeline stage 3'. The pipeline stage 1' includes one aspect of the GSHE MTJ element 10(AND) and one aspect of the GSHE MTJ element 10(NAND) described above with respect to FIG. 8. The pipeline stage 2' includes one aspect of the GSHE MTJ element 10(AND) described above with respect to FIG. 8. The pipeline stage 2' also includes an MTJ element 10(AND)', which is also an aspect of the GSHE MTJ element 10(AND) described above with respect to FIG. 8. The pipeline stage 3' includes one aspect of the GSHE MTJ element 10(NOR) and one aspect of the GSHE MTJ element 10(AND) described above with respect to FIG. 8.

Referring again to FIGS. 15A and 15B, FIG. 15B illustrates a timing diagram that represents the control state of the control signal Φ1, the control state of the control signal D2, and the control state of the control signal Φ3. In a preset mode 1', the GSHE MTJ element 10(AND) and the GSHE MTJ element 10(NAND) in the pipeline stage 1' are preset to their default logical values (i.e., logical "1" and logical "0," respectively). Next, in a compute mode 1', charge current 20(P) is provided to the GSHE MTJ element 10(AND) and the GSHE MTJ element 10(NAND) in the pipeline stage 1'. In response to the charge current 20(P), the GSHE MTJ element 10(AND) and the GSHE MTJ element 10(NAND) in the pipeline stage 1' generate the GSHE spin current 22(AND) and the GSHE spin current 22(NAND), respectively. As such, the GSHE MTJ element 10(AND) and the GSHE MTJ element 10(NAND) in the pipeline stage 1' each perform their corresponding logical operations. The pipeline stage 1' is provided with the charge current 20(P) from a previous pipeline stage (not shown). Bit states from the previous pipeline stages are thus read in the compute mode 1' and the GSHE MTJ element 10(AND) and the GSHE MTJ element 10(NAND) perform their respective logical operations. The pipeline stage 2' provides isolation during both the preset mode 1' and the compute mode 1'.

In a preset mode 2', the GSHE MTJ element 10(AND) and the GSHE MTJ element 10(AND)' in the pipeline stage 2' are preset to their default logical values (i.e., logical "1" and logical "1," respectively). Next, in a compute mode 2', charge currents 30(AND) and 30(NAND) generated by the GSHE MTJ element 10(AND) and the GSHE MTJ element 10(NAND) in the pipeline stage 1' are combined into a charge current 20(L1). The charge current 20(L1) is provided to the GSHE MTJ element 10(AND) and the GSHE MTJ element 10(AND)' in the pipeline stage 2' during the compute mode 2'. In response to the charge current 20(L1), the GSHE MTJ element 10(AND) and the GSHE MTJ element 10(AND)' in the pipeline stage 2' generate the GSHE spin current 22(AND) and a GSHE spin current 22(AND)', respectively. As such, the GSHE MTJ element 10(AND) and the GSHE MTJ element 10(AND)' in the pipeline stage 2' each perform their corresponding logical operations. The bit states from the pipeline stage 1' are thus read in the compute mode 2' and the GSHE MTJ element 10(AND) and the GSHE MTJ element 10(AND)' in the pipeline stage 2' perform their respective logical operations. The pipeline stage 3' provides isolation both in the preset mode 2' and the compute mode 2'.

In a preset mode 3', the GSHE MTJ element 10(NOR) and the GSHE MTJ element 10(AND) in the pipeline stage 3' are preset to their default logical values (i.e., logical "0" and logical "0," respectively). Next, in a compute mode 3', the GSHE MTJ element 10(AND) in the pipeline stage 2' generates the charge current 30(AND) and the GSHE MTJ element 10(AND)' generates a charge current 30(AND)', respectively. The charge current 30(AND) and the charge current 30(AND)' from the pipeline stage 2' are combined to provide a charge current 20(L2) to the pipeline stage 3'. In response to the charge current 20(L2), the GSHE MTJ element 10(NOR) and the GSHE MTJ element 10(AND) in the pipeline stage 3' generate the GSHE spin current 22(NOR) and the GSHE spin current 22(AND), respectively, so as to perform their corresponding logical operations. The bit states from the pipeline stage 2' are thus read and the GSHE MTJ element 10(AND) in the pipeline stage 3' each perform their respective logical operations during the compute mode 3'. The pipeline stage 1' provides isolation both in the preset mode 3' and the compute mode 3'. Also, during the compute mode 1', the GSHE MTJ element 10(NOR) and the GSHE MTJ element 10(AND) in the pipeline stage 3' generate the charge currents 30(NOR) and 30(AND). The charge currents 30(NOR) and 30(AND) from the pipeline stage 3' are combined into a charge current 20(L3) from the pipeline stage 3'. As such, the bit states from the pipeline stage 3' are read during the compute mode 1'.

Once again, in pipeline circuit 78, for an intended charge current 20(L1) provided to the GSHE MTJ element 10(AND) and the GSHE MTJ element 10(AND)' in the pipeline stage 2' during the compute mode 2' (shown as example current path 152), an unintended sneak path 150 may arise to cause an unintentional write to the pipeline stage adjacent to, and following pipeline stage 3' (shown as pipeline stage 4' without specific illustration of the GSHE MTJ elements).

Figure 16A:
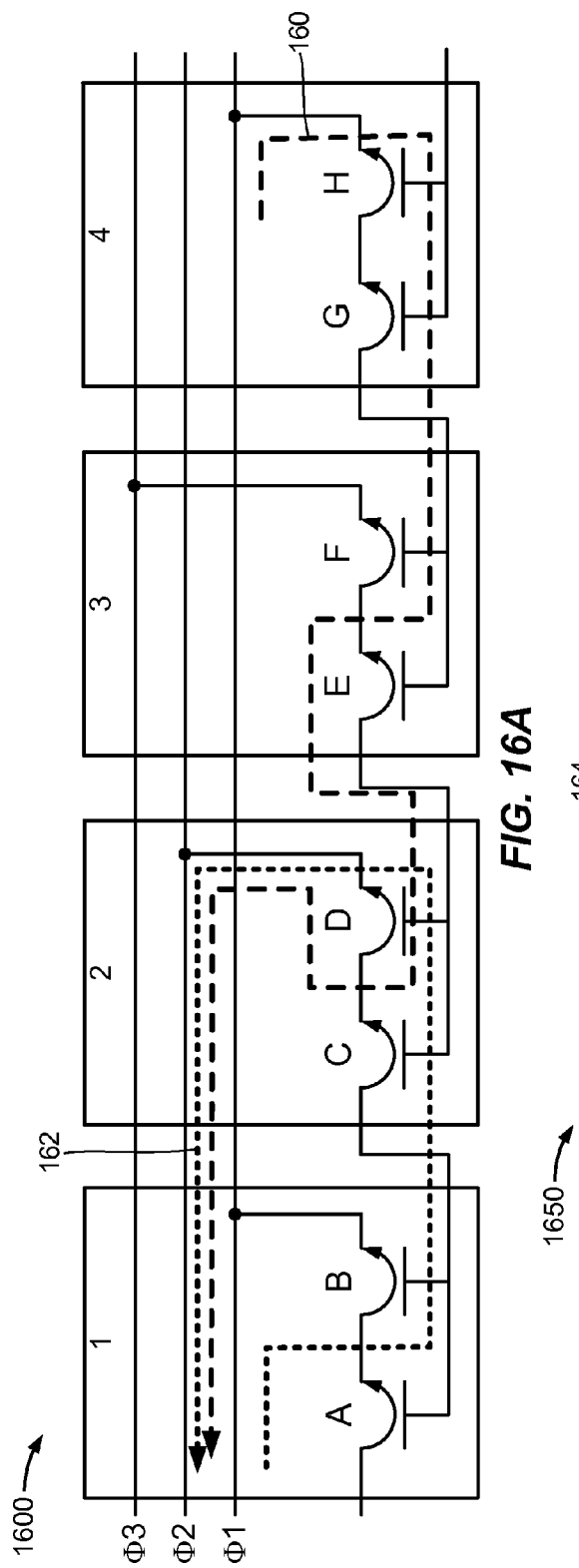
FIGS. 16A-B illustrate sneak paths in circuits formed from spintronic logic gates.
Figure 16B:
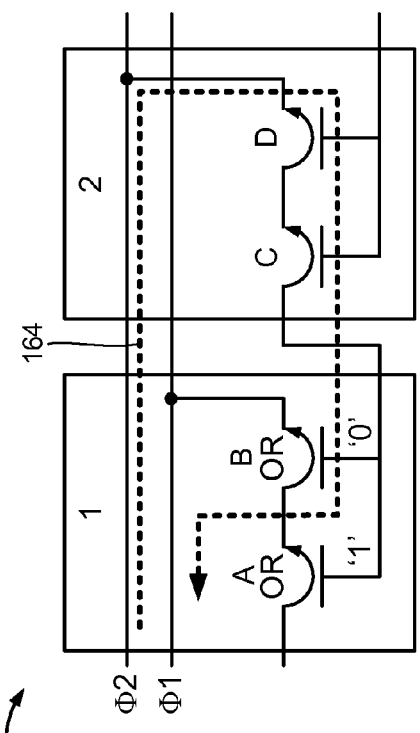

The above sneak paths discussed in relation to FIGS. 12, 13, 14A, and 15A above are summed up in example circuits 1600 and 1650 shown in FIGS. 16A and 16B respectively. In FIG. 16A, a pipeline circuit 1600 similar to the pipeline circuits 76 and 78 discussed with reference to FIGS. 14A and 15A-B is shown. The pipeline circuit 1600 shows four pipeline stages 1-4, with pipeline stage 1 having GSHE MTJ elements A, B; pipeline stage 2 having GSHE MTJ elements C, D; pipeline stage 3 having GSHE MTJ elements E, F; and pipeline stage 2 having GSHE MTJ elements G, H. Once again an example intended write current path 162 is shown for writing GSHE MTJ elements C and D in pipeline stage 2. However, in one example, if GSHE MTJ elements, C, D, E, and F are in low resistance states while GSHE MTJ elements A and B are in high resistance state (based, for example, on their respective integer values m, n and preset values stored therein), the unintended sneak path may cause GSHE MTJ elements G and H in pipeline stage 4 to also get written.

With reference to FIG. 16B, a pipeline circuit 1650 is illustrated with GSHE MTJ elements A and B in pipeline stage 1 and GSHE MTJ elements C and D in pipeline stage 2. Sneak path 164 illustrates a reverse path for the preset current (e.g., the preset current 66 of FIGS. 11, 12, 13, or the preset current developed in preset mode 2 of pipeline stage 2 of FIG. 16A).

Figure 17:
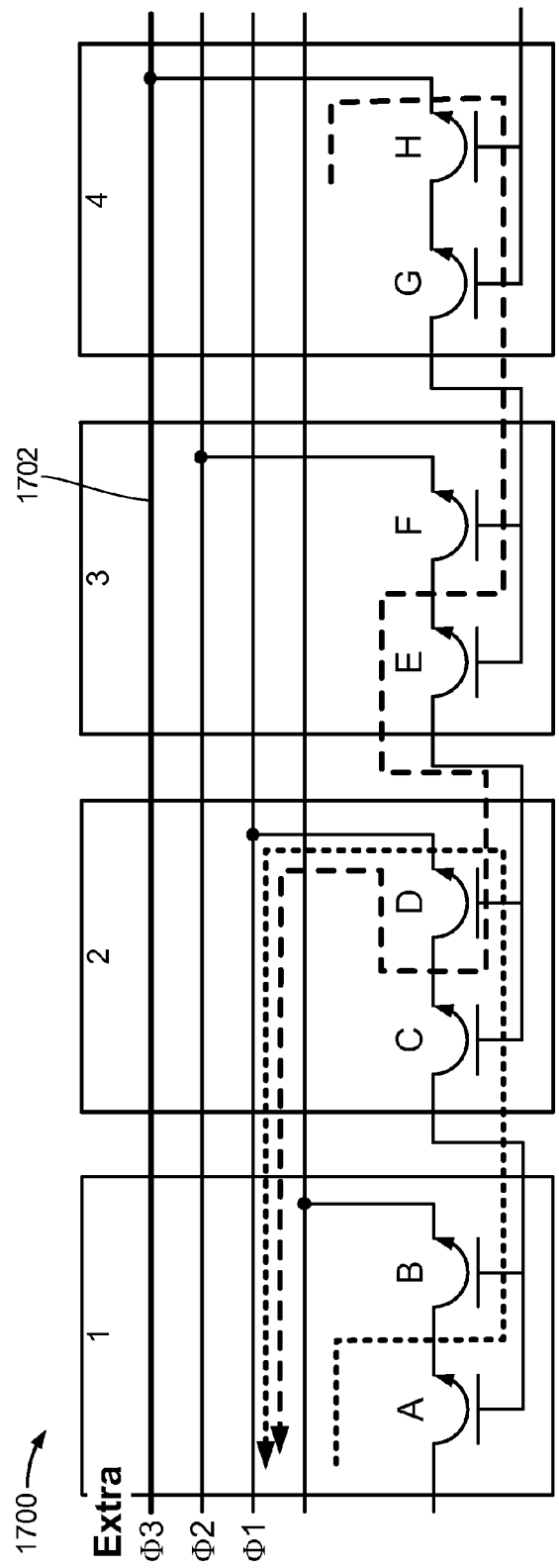
FIG. 17 illustrates a conventional attempt to solve the sneak path problems of FIGS. 16A-B.

FIG. 17 illustrates a conventional attempt for overcoming sneak paths such as the sneak path 160. In the pipeline circuit 1700 of FIG. 17, an additional or "extra" control signal 1702 is added to the pipeline circuit 1600 of FIG. 16A for example. Rather than connecting the GSHE MTJ element H to the control signal $\Phi 1$ as in the pipeline circuit 1600, the GSHE MTJ element H is connected to the extra control signal 1702 in the pipeline circuit 1700. This extra control signal 1702 is not driven high at the same time that the control signal $\Phi 1$ is driven high (e.g., during the pipeline stage 2). On the other hand, the extra control signal 1702 may be driven high during the pipeline stage 4 but not the pipeline stage 2. In this manner, the sneak path 160 can be avoided. However, the pipeline circuit 1700 requires at least the four pipeline stages shown, to separate two pipeline stages between which a potential sneak path may arise. Considering at least three device threshold currents and two device resistance states (i.e., logical "1"/high resistance/anti-parallel state or logical "0"/parallel/low resistance state) for the GSHE MTJ elements, this implies at least six control lines and four stages for every two pipeline stages between which sneak paths are desired to be eliminated. Thus, the pipeline circuit 1700 requires significant additional area and power and also added complexity incurred by the extra control lines. Moreover, the pipeline circuit 1700 cannot eliminate the sneak paths such as the sneak path 164 associated with the reverse path for the preset currents, for example.

Figure 18:
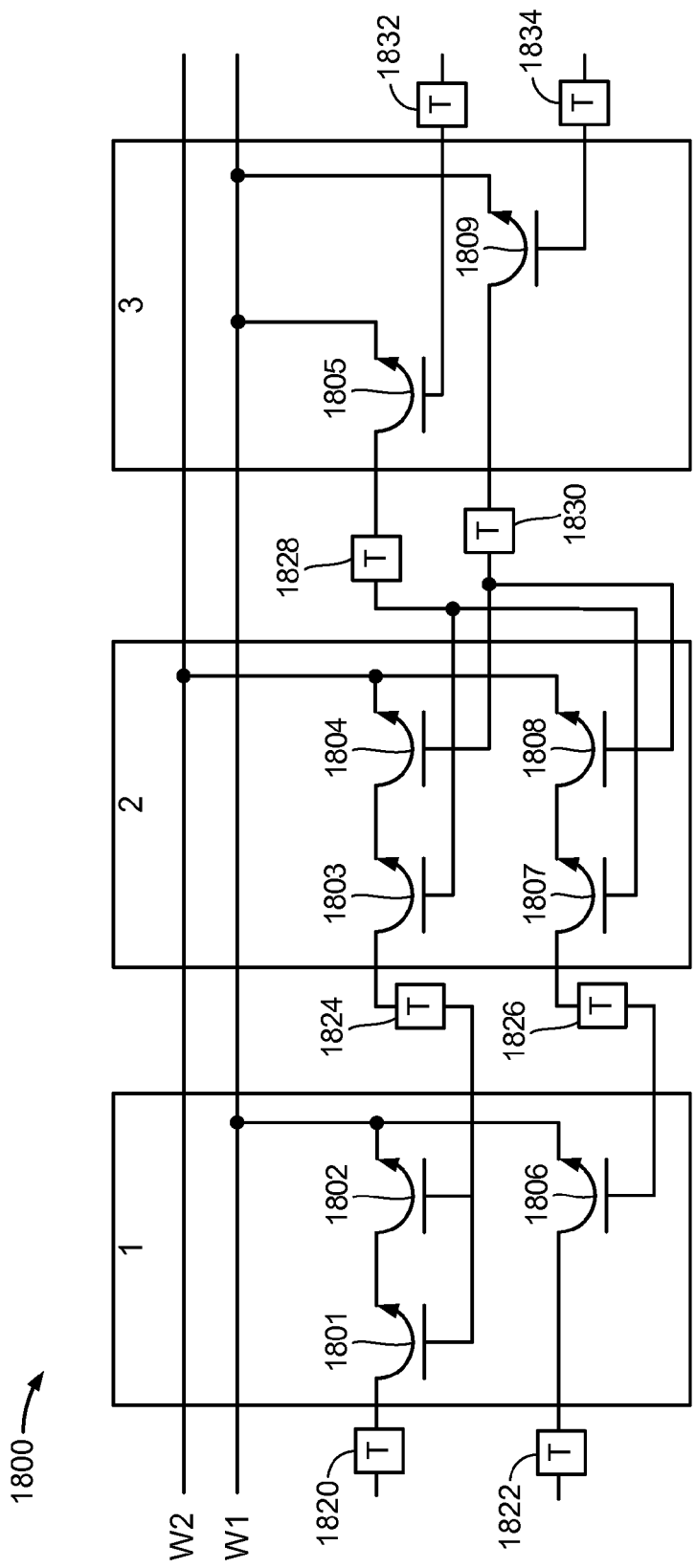
FIG. 18 illustrates an exemplary aspect related to eliminating sneak paths using transistors.

Accordingly, with reference to FIG. 18, circuit 1800 according to an exemplary aspect of this disclosure is illustrated. Exemplary circuit 1800 eliminates both types of sneak paths discussed above (e.g., sneak paths 160 and 164) without incurring the added complexity and penalties of the pipeline circuit 1700. More specifically, exemplary circuit 1800 is shown with three example pipeline stages 1-3, each comprising spintronic logic gates formed from GSHE MTJ elements connected to the control signals W1 and W2. Pipeline stage 1 includes the GSHE MTJ elements 1801, 1802, and 1806; pipeline stage 2 includes the GSHE MTJ elements 1803, 1804, 1807, and 1808; and pipeline stage 3 includes the GSHE MTJ elements 1805 and 1809. Like the GSHE MTJ elements 10 discussed in prior examples, the GSHE MTJ elements of FIG. 18 may be configured to provide different logical functions, but these will not be discussed in greater detail herein for the sake of brevity.

In order to eliminate sneak paths caused by the charge currents supplied to preset or compute modes of GSHE MTJ elements in one pipeline stage undesirably flowing into a different pipeline stage, the transistors 1820-1834 are introduced in the circuit 1800. More specifically, the transistors 1820 and 1822 can prevent sneak paths due to write currents from a pipeline stage prior to pipeline stage 1 from entering the pipeline stage 1 (or beyond). Similarly, the transistors 1824 and 1826 can prevent sneak paths due to write currents intended for writing the GSHE MTJ elements in the pipeline stage 1 from undesirably flowing into the pipeline stage 2 (or beyond). In like manner, the transistors 1828 and 1830 prevent sneak path currents from flowing into the pipeline stage 3 from the previous pipeline stages and the transistors 1832 and 1834 prevent sneak path currents from flowing into a pipeline stage following the pipeline stage 3. The transistors 1820-1834 can be MOS based transistors and they may be controlled as on/off switches to enable or disable the flow of current through them. In this manner, the pipeline circuit 1800 eliminates sneak paths due to write currents (e.g., preset or compute mode charge currents).

Figure 19:
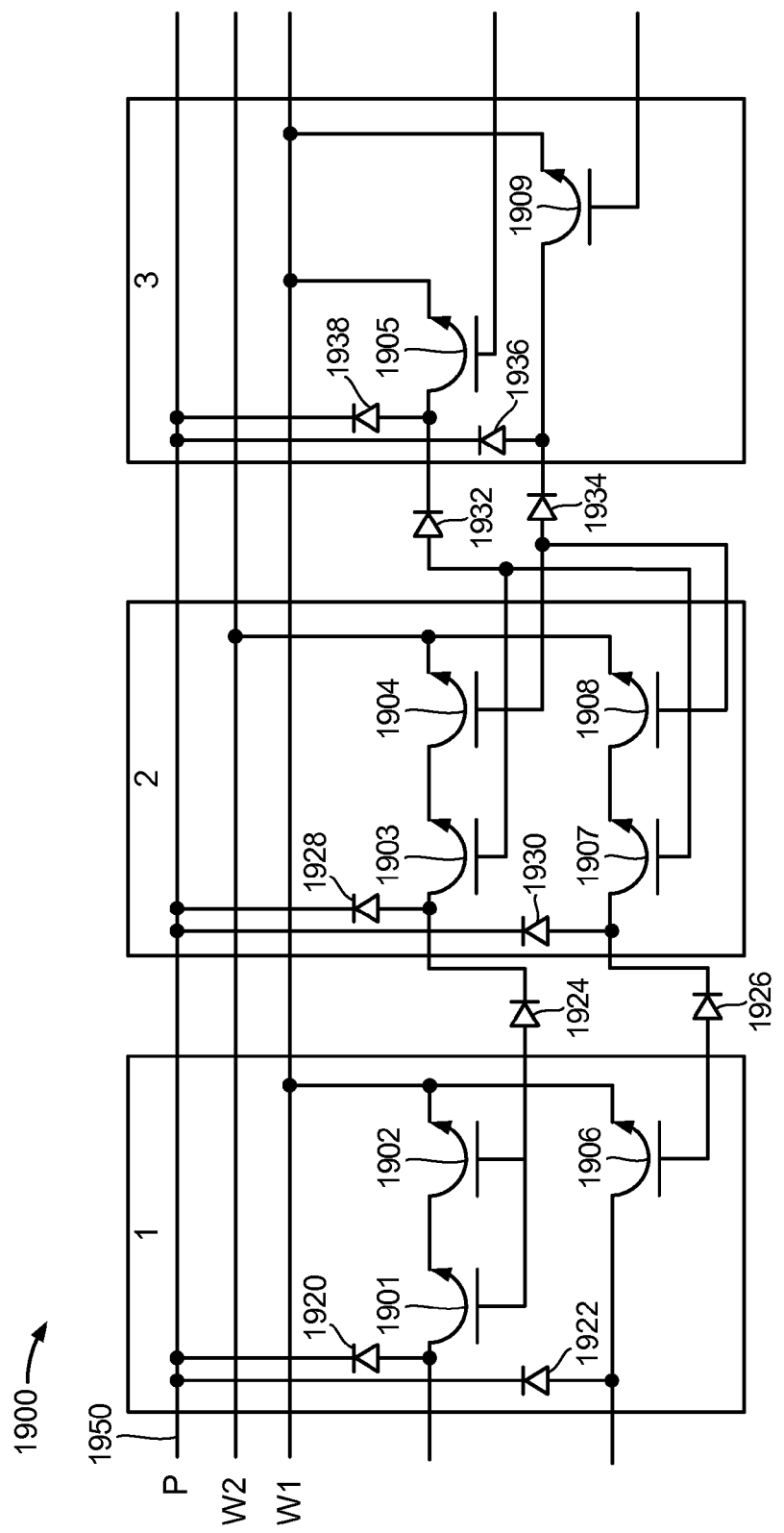
FIG. 19 illustrates an exemplary aspect related to eliminating sneak paths using diodes.

In FIG. 19, another exemplary aspect of this disclosure is illustrated with reference to the circuit 1900. Rather than the transistors 1820-1834 of the circuit 1800, exemplary circuit 1900 includes diodes 1920-1938. Circuit 1900 is also shown with three example pipeline stages 1-3, each comprising spintronic logic gates formed from GSHE MTJ elements connected to the control signals W1 and W2. Pipeline stage 1 includes the GSHE MTJ elements 1901, 1902, and 1906; pipeline stage 2 includes the GSHE MTJ elements 1903, 1904, 1907, and 1908; and pipeline stage 3 includes the GSHE MTJ elements 1905 and 1909. Circuit 1900 includes a preset line "P" 1950, which is not a control line, but may be a wire or net to provide an alternative path for preset current to flow. In other words, unlike the control signals W1 and W2 (or control signals D1, D2, and 03 of FIGS. 11-17) whose values need to be controlled according to the operation and values to be written, the preset line P 1950 is an alternative path for preset currents to flow, eliminating harmful reverse paths such as the sneak path 164 shown in FIG. 16B.

More specifically, the diodes 1920 and 1922 couple input lines to the preset line 1950, where the diodes 1920 and 1922 only allow current to flow in one direction, i.e., from the input lines to the preset line 1950. A reverse direction of current flow is prevented due to the diode's structure, which eliminates reverse paths such as the sneak path 164, for example. Diodes 1928 and 1930 are similar to diodes 1922 and 1920, which prevent reverse currents from the preset current supplied to the pipeline stage 2. Likewise, the diodes 1936 and 1938 prevent reverse currents from the present current supplied to the pipeline stage 3.

In addition, the diodes 1924 and 1926 are included between pipeline stages 1 and 2, for example, which also only permit current to flow in the intended direction. Unintended current paths in the reverse directions are prevented, which also eliminate other types of sneak paths, such as the sneak path 160 of FIG. 16A from arising. Similarly, the diodes 1932 and 1934 are included between pipeline stages 2 and 3, for example, which also only permit current to flow in the intended direction, to prevent sneak paths between the two pipeline stages.

Figures 20A, 20B:
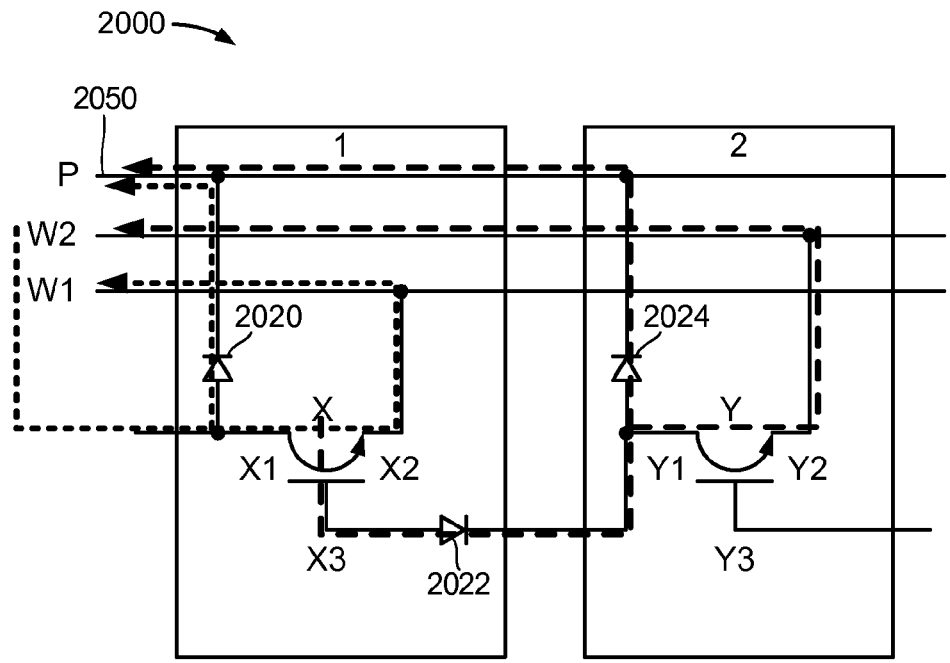
FIGS. 20A-B illustrate another exemplary aspect related to eliminating sneak paths using transistors and a related truth table.

With reference now to FIGS. 20A-B, another exemplary aspect of preventing sneak paths using diodes is illustrated. More particularly, in FIG. 20A, circuit 2000 is shown with two pipeline stages 1 and 2, each comprising spintronic logic gates formed from GSHE MTJ elements connected to the control signals W1 and W2. Similar to the preset line P 1950 of the circuit 1900, circuit 2000 also includes a preset line P 2050. To better aid in the explanation of FIG. 20A, different reference numerals have been used to refer to the GSHE elements and their respective charge current nodes. More specifically, the charge current nodes of the GSHE MTJ element X of pipeline stage 1 includes the charge current nodes or terminals X1, X2, and X3 (with X3 being the read terminal), and similarly, GSHE MTJ element Y of pipeline stage 2 includes the terminals Y1, Y2, and Y3. During a compute mode for pipeline stage 1, the intended current path will be from the terminal X1 to the terminal X2. The preset current flow will be in the reverse direction from the terminal X2 to X1. The present current can cause a sneak path if preventive mechanisms are not in place. This potential sneak path is eliminated with diode 2020 coupling the input terminal X1 to the preset line P 2050. Similarly, the GHSE MTJ element Y of the pipeline stage 2 has terminals Y1, Y2, and Y3, with terminal Y1 connected to the preset line P 2050 through diode 2024, in order to eliminate a sneak path related to the preset current from Y2 to Y1. Diode 2022 is used between the read terminal X3 of GSHE MTJ element X and the input terminal Y1 of the GSHE MTJ element Y. Diode 2022 prevents a write path for charge current supplied to GSHE MTJ element X from flowing in an unintended and undesirable manner into GSHE MTJ element Y.

In some aspects, diode 2022 may also be replaced by a transistor such as the transistors 1820-1834 of circuit 1800 of FIG. 18, for example. Transistors may be used instead of diode 2022 where specific control of operations within the pipeline stage may be required, since the transistors may be selectively turned on or off. Diodes on the other hand are always configured to conduct in one direction but prevent current flow in the opposite direction.

FIG. 20B illustrates a truth table for the control signals W1, W2 and the preset line P 2050 for the circuit 2000. The first row shows the preset mode 1 for the pipeline stage 1, wherein the write control signal W1 provides a preset current and the preset line P 2050 is driven to 0. The write control signal W2 is in a high impedance or floating stage during the preset mode 1. For the compute or write mode 1 of the pipeline stage 1 (second row), the write control signal W2 is driven high while the write control signal W1 is driven low. The preset line P 2050 is floating in this mode, since it is connected to the diode 2020 which does not permit the preset current from the preset mode 1 to flow into the preset line 2050.

The reverse values of the write control signals W1 and W2 are seen in the third and fourth rows related to the preset mode 2 and the write mode 2 of the pipeline stage 2 respectively. More specifically, as shown in the third row for the preset mode 2 for the pipeline stage 2, the write control signal W2 provides a preset current and the preset line P 2050 is driven to 0. The control signal W1 is in a high impedance or floating stage during the preset mode 2. For the compute or write mode 2 of the pipeline stage 2 (fourth row), the write control signal W1 is driven high while the write control signal W2 is driven low. The preset line P 2050 is once again floating in this mode, since the diode 2024 does not permit current flow to the preset line 2050 in this mode.

Figure 21A:
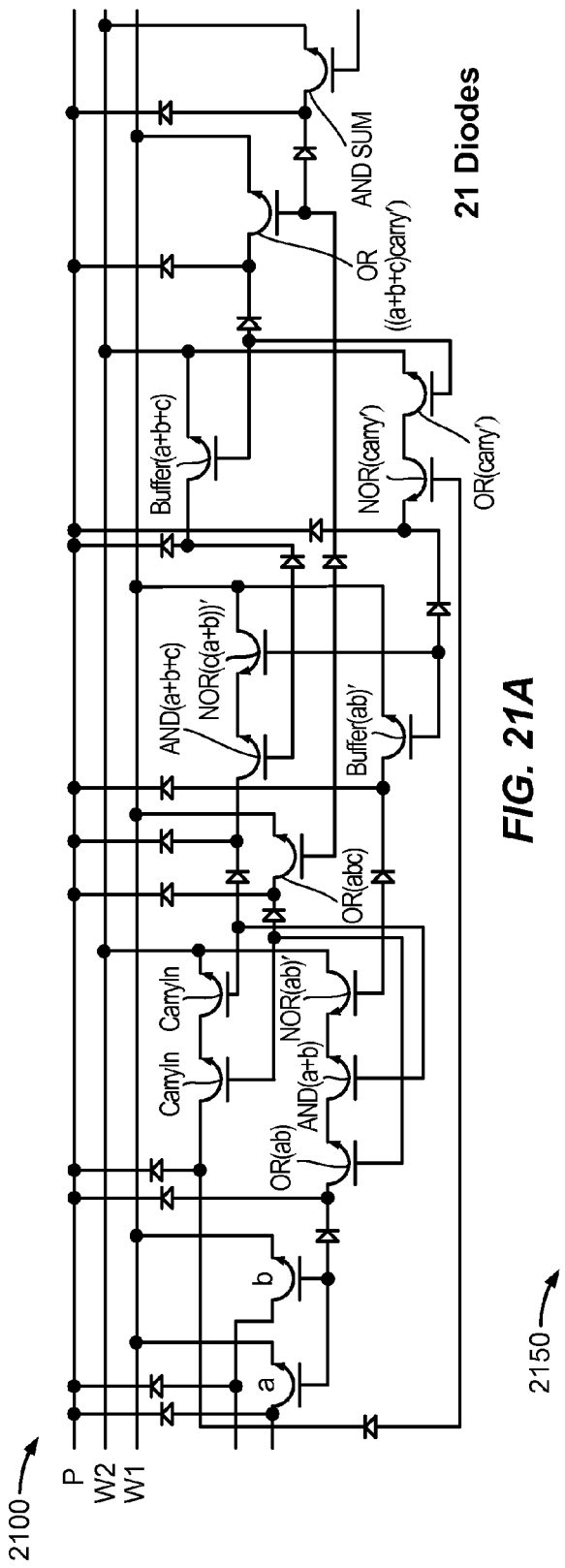
FIGS. 21A-B illustrate single bit adder designs formed from spintronic logic gates, including the sneak path prevention mechanisms of exemplary aspects.
Figure 21B:
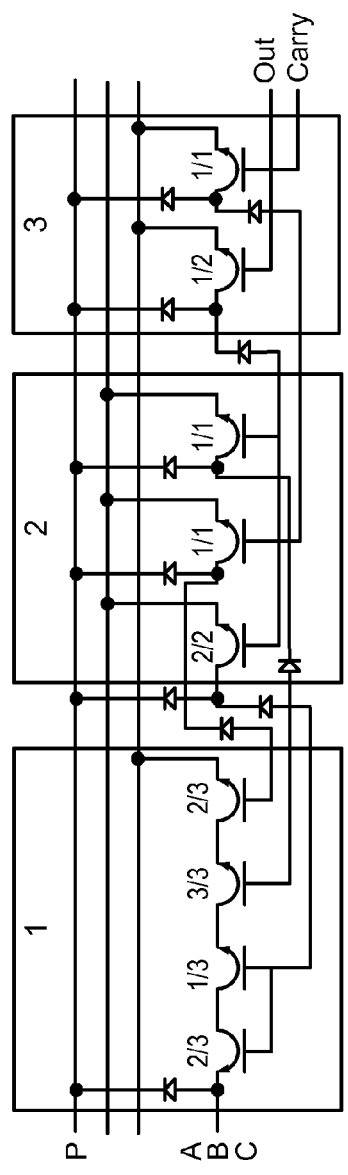

FIGS. 21A-B illustrate example applications of the above aspects for preventing sneak paths using diodes in spintronic logic circuits. For example, FIG. 21A shows an example configuration of an adder 2100 with two input lines and one input device (e.g., input bits B1 and B2 similar to circuit 60 of FIG. 8). An adder, as known in the art is used to add three binary bits (e.g., a first input bit A, a second input bit B, and a carry-in bit) to generate two output bits (e.g., a sum bit and a carry-out bit). Adder 2100 implemented with only two input lines in combinational logic using spintronic logic gates can be configured for eliminating sneak paths with the placement of diodes as shown in FIG. 21A. In this configuration, 21 diodes can be implemented as shown to eliminate sneak paths.

FIG. 21B shows a more efficient implementation of an adder 2150 using spintronic logic gates in a pipelined implementation comprising three pipeline stages 1-3, each formed from GSHE MTJ elements. Adder 2150 is a full adder with three input bits and two output bits. As shown, a three-input device is configured rather than the two-input structure of adder 2100, wherein three input bits "A," "B," and "C" are accepted on the input line in order to generate the two outputs, "out" and "carry." In exemplary aspects, adder 2150 can be implemented with spintronic logic gates in a structure which avoids aforementioned sneak paths. Adder 2150 is efficiently configured with 11 diodes to prevent sneak paths, in comparison to the 21 diodes of adder 2100.

FIGS. 22A-C illustrate further details of exemplary aspects applied to the design of adders. FIG. 22A illustrates an N-bit adder implemented using 1-bit adders such as adders 2100 and 2150 of FIGS. 21A-B above. Logically, the illustrated N-bit adder is configured similar to a stream bit adder used in signal processing applications, wherein the carry-out output of a single bit adder is connected back to its carry-in input after being passed through a latch. A conventional stream bit adder will be described briefly in order to explain the inventive aspects. In contrast to a parallel adder, a conventional stream bit adder or a sequential adder mimics a pen-and-paper method of adding two multi-bit numbers. In a conventional stream bit adder implemented in hardware or a combination or hardware and software, a staged or pipelined process of adding two n-bit numbers (e.g., A[n−1:0] and B[n−1:0]) is implemented. Starting from the least significant bits A[0] and B[0], for example, the two bits (with a carry-in, if any, or a "0" carry-in) can be fed to the adder in a first pipeline stage, for example. A result sum[0] and a carry-out C[0] are generated in the first stage. In the next, second stage, higher order bits A[1] and B[1] are shifted in to the adder and C[0] from the previous, first stage is also fed in to the adder, which generates a sum[1] and a carry-out C[1] to be used in the next, third stage, and so on. Thus, the carry-out from a previous stage is latched and used as a carry-in or third input for a current stage. When this process is performed in a pipelined or staged fashion, all n bits of the two numbers A[n−1:0] and B[n−1:0] can be added to generate an output which can be represented with n+1 bits. As seen, the stream bit adder requires the implementation of an adder and a latch.

In exemplary aspects of implementing a stream bit adder with spintronic gates formed from GSHE MTJ elements, the nature of these gates to store information is taken advantage of. Since the exemplary spintronic logic gates are non-volatile and they have a self-storing or self-latching ability built in, an exemplary stream bit adder can be configured without a latch. For example, the above-described full adder 2150 can be used to implement an n-bit stream adder to add a stream of one or more bits without requiring additional storage circuits for storing the carry-out bit from a previous stage to add in to a current stage. By simply tying the carry-out (CO) to the carry-in (Cin), the single full adder 2150 can be configured to sequentially add 3 bits in each of the n stages for adding the two numbers A[n−1:0] and B[n−1:0]. In this manner, the latch required in a conventional stream bit adder to store the carry-out (Cout) from the previous stage, as shown in FIG. 22B, can be avoided.

An equivalent circuit of FIG. 22B using conventional logic gates is shown in FIG. 22C. As seen from FIG. 22C, 32 transistors are required to form a 1-bit adder using conventional logic gates. On the other hand, even with the implementation of diodes to avoid sneak paths using spintronic logic implemented from GSHE MTJ elements (e.g., adder 2100), only 21 diodes are needed at the worst case (with an improvement to only 11 diodes in adder 2150). Thus, in these example applications for 1-bit adder designs, it is seen that even with the addition of the exemplary diodes to eliminate the sneak paths, the corresponding increase in area and cost does not exceed the cost of implementing corresponding logic using conventional logic gates (e.g., MOS based transistors).

Figure 23:
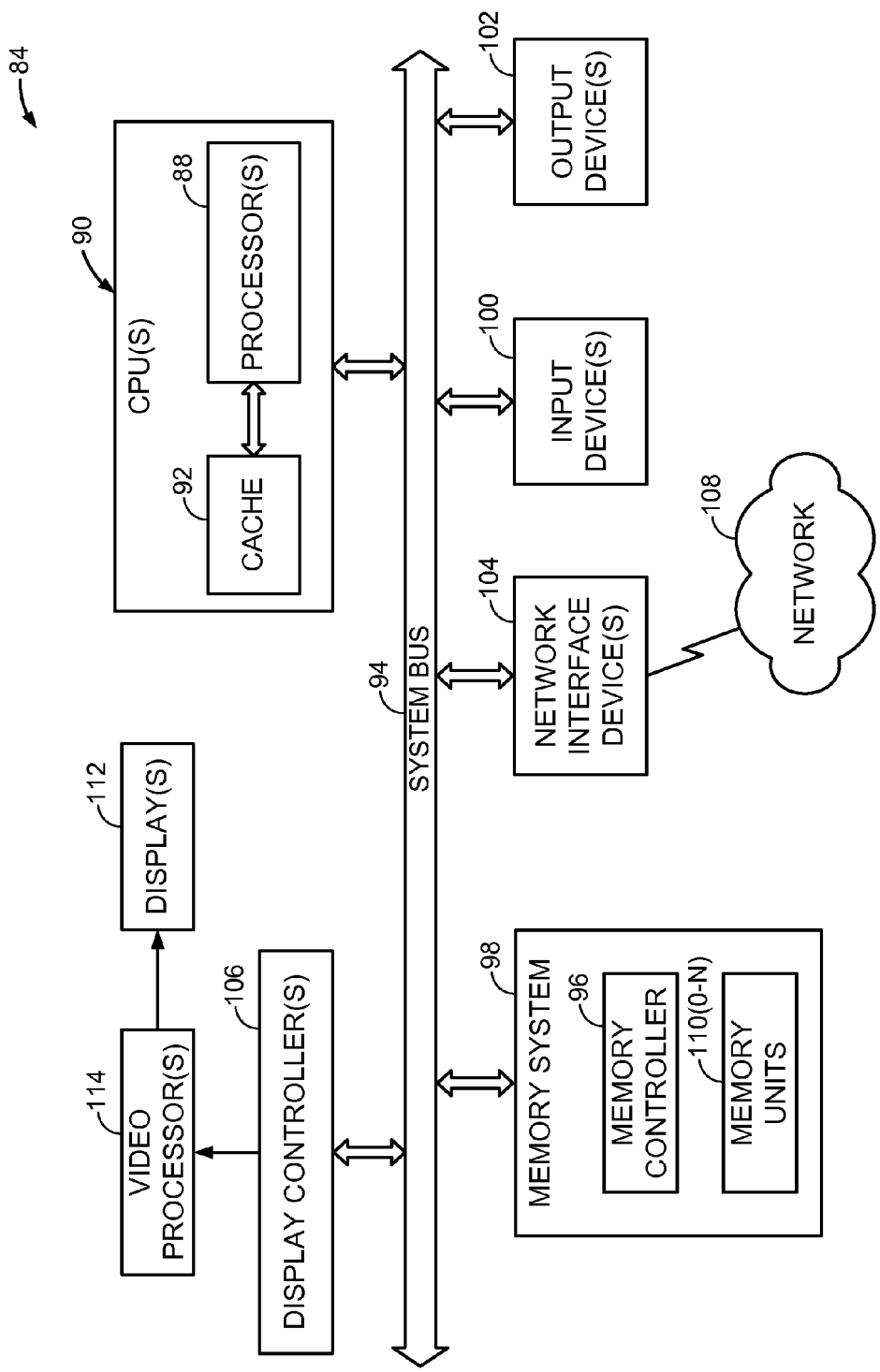
FIG. 23 is a block diagram of an exemplary processor-based system that can include exemplary aspects of this disclosure.

FIG. 23 illustrates an example of a processor-based system 84 that can employ the GSHE MTJ element 10, the spintronic logic gates 60, 68, 72, and 74, and the pipeline circuits 76, 78, 80, and 82 of exemplary aspects described herein. In this example, the processor-based system 84 includes one or more central processing units (CPUs) 86, each including one or more processors 88. The CPU(s) 86 may be a master device 90. The CPU(s) 86 may have cache memory 92 coupled to the processor(s) 88 for rapid access to temporarily stored data. The CPU(s) 86 is coupled to a system bus 94 and can intercouple master and slave devices included in the processor-based system 84. As is well known, the CPU(s) 86 communicates with these other devices by exchanging address, control, and data information over the system bus 94. For example, the CPU(s) 86 can communicate bus transaction requests to the memory controller 96 as an example of a slave device. Although not illustrated in FIG. 18, multiple system buses 94 could be provided, wherein each system bus 94 constitutes a different fabric.

Other master and slave devices can be connected to the system bus 94. As illustrated in FIG. 18, these devices can include a memory system 98, one or more input devices 100, one or more output devices 102, one or more network interface devices 104, and one or more display controllers 106, as examples. The input device(s) 100 can include any type of input device, including but not limited to input keys, switches, voice processors, etc. The output device(s) 102 can include any type of output device, including but not limited to audio, video, other visual indicators, etc. The network interface device(s) 104 can be any devices configured to allow exchange of data to and from a network 108. The network 108 can be any type of network, including but not limited to a wired or wireless network, private or public network, a local area network (LAN), a wide local area network (WLAN), and the Internet. The network interface device(s) 104 can be configured to support any type of communication protocol desired. The memory system 98 can include one or more memory units 110(0-N).

The CPU(s) 86 may also be configured to access the display controller(s) 106 over the system bus 94 to control information sent to one or more displays 112. The display controller(s) 106 sends information to the display(s) 112 to be displayed via one or more video processors 114, which process the information to be displayed into a format suitable for the display(s) 112. The display(s) 112 can include any type of display, including but not limited to a cathode ray tube (CRT), a liquid crystal display (LCD), a plasma display, etc.

Figure 24:
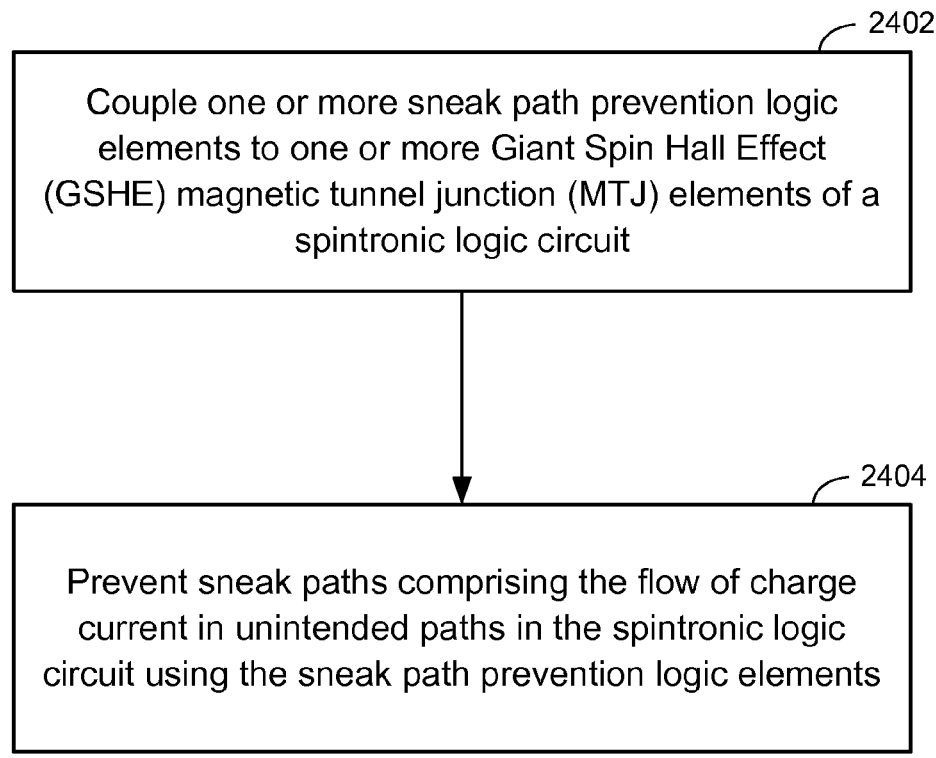
FIG. 24 illustrates a flow-chart for a method of preventing sneak paths in a spintronic logic circuit.

It will be appreciated that embodiments include various methods for performing the processes, functions and/or algorithms disclosed herein. For example, in FIG. 24, an exemplary aspect can include a method of preventing sneak paths in a spintronic logic circuit (e.g., circuit 1800/1900), the method comprising: coupling one or more sneak path prevention logic elements (e.g., transistors 1820-1834 of circuit 1800/diodes 1920-1938 and preset line P 1950 of circuit 1900) to one or more Giant Spin Hall Effect (GSHE) magnetic tunnel junction (MTJ) elements (e.g., GSHE MTJ elements 1801-1809 of circuit 1800/GSHE MTJ elements 1901-1909 of circuit 1900) of the spintronic logic circuit—Block 2402; and preventing sneak paths (e.g., 160/164 shown in circuits 1600 and 1650) comprising the flow of charge current in unintended paths in the spintronic logic circuit using the sneak path prevention logic elements—Block 2404.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for avoiding sneak paths in circuits formed from spintronic logic gates comprising GSHE MTJ elements. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A spintronic logic circuit comprising:
   one or more Giant Spin Hall Effect (GSHE) magnetic tunnel junction (MTJ) elements; and
   sneak path prevention logic coupled to the GSHE MTJ elements, the sneak path prevention logic configured to prevent sneak paths comprising the flow of charge current in unintended paths in the spintronic logic circuit.

2. The spintronic logic circuit of claim 1 comprising:
   two or more pipeline stages comprising the one or more GSHE MTJ elements; and
   a charge current generation circuit configured to provide write current to the one or more GSHE MTJ elements, wherein the sneak path prevention logic comprises one or more transistors coupled to the one or more GSHE MTJ elements, the transistors configured to restrict the write current from flowing from an intended pipeline stage to an unintended pipeline stage during a write operation.

3. The spintronic logic circuit of claim 1, wherein the sneak path prevention logic comprises one or more diodes coupled to the one or more GSHE MTJ elements and configured to prevent a preset current from flowing into input circuitry or a charge current generation circuit.

4. The spintronic logic circuit of claim 3, further comprising a preset line configured to provide an alternative path for the preset current.

5. The spintronic logic circuit of claim 1 comprising a stream bit adder, the stream bit adder comprising a single bit adder configured to add a stream of one or more bits in one or more pipeline stages.

6. The spintronic logic circuit of claim 5, wherein the single bit adder comprises:
   logic configured to add a first input bit, a second input bit, and a carry-in bit to generate a carry-out bit and a sum bit, wherein the carry-out bit is coupled to the carry-in bit.

7. A method of preventing sneak paths in a spintronic logic circuit, the method comprising:
   coupling one or more sneak path prevention logic elements to one or more Giant Spin Hall Effect (GSHE) magnetic tunnel junction (MTJ) elements of the spintronic logic circuit; and
   preventing sneak paths comprising the flow of charge current in unintended paths in the spintronic logic circuit using the sneak path prevention logic elements.

8. The method of claim 7 comprising:
   partitioning the one or more GSHE MTJ elements into two or more pipeline stages; and
   providing write current to the GSHE MTJ elements from a charge current generation circuit, wherein preventing the sneak paths comprises preventing the write current from flowing from an intended pipeline stage to an unintended pipeline stage during a write operation.

9. The method of claim 8, wherein the sneak path prevention logic comprises one or more transistors coupled to the one or more GSHE MTJ elements.

10. The method of claim 8, wherein the sneak path prevention logic comprises one or more diodes coupled to the one or more GSHE MTJ elements.

11. The method of claim 7, comprising preventing a preset current from flowing into input circuitry or a charge current generation circuit wherein the sneak path prevention logic comprises one or more diodes coupled to the one or more GSHE MTJ elements.

12. The method of claim 11, further comprising coupling a preset line to one or more GSHE MTJ elements to provide an alternative path for the preset current.

13. The method of claim 7 comprising configuring the spintronic logic circuit as a stream bit adder, the stream bit adder comprising a single bit adder for adding a stream of one or more bits in one or more pipeline stages.

14. The method of claim 13, comprising adding a first input bit, a second input bit, and a carry-in bit in the single bit adder in a first pipeline stage to generate a carry-out bit and a sum bit, and coupling the carry-out bit to the carry-in bit.

15. A spintronic logic circuit comprising:
   one or more Giant Spin Hall Effect (GSHE) magnetic tunnel junction (MTJ) elements; and
   means for preventing sneak paths comprising the flow of charge current in unintended paths in the spintronic logic circuit.

16. The spintronic logic circuit of claim 15 comprising:
   two or more pipeline stages comprising the one or more GSHE MTJ elements; and wherein the means for preventing sneak paths comprises means for preventing write current from flowing from an intended pipeline stage to an unintended pipeline stage during a write operation.

17. The spintronic logic circuit of claim 16, wherein the means for preventing sneak paths comprises one or more transistors coupled to the one or more GSHE MTJ elements.

18. The spintronic logic circuit of claim 16, wherein the means for preventing sneak paths comprises one or more diodes coupled to the one or more GSHE MTJ elements.

19. The spintronic logic circuit of claim 15, wherein the means for preventing sneak paths comprises means for preventing a preset current from flowing into input circuitry or a charge current generation circuit.

20. The spintronic logic circuit of claim 19, further comprising means for providing an alternative path for the preset current.

* * * * *